US012796152B2

(12) United States Patent
Kim et al.

(10) Patent No.: US 12,796,152 B2
(45) Date of Patent: Nov. 10, 2026

(54) IMAGE SENSOR INCLUDING STACKED CAPACITORS

(71) Applicant: SAMSUNG ELECTRONICS CO., LTD., Suwon-si (KR)

(72) Inventors: Jungsan Kim, Suwon-si (KR); Seungho Lee, Suwon-si (KR); Taemin Kim, Suwon-si (KR); Yongsoon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 212 days.

(21) Appl. No.: 18/761,452

(22) Filed: Jul. 2, 2024

(65) Prior Publication Data

US 2025/0212546 A1 Jun. 26, 2025

(30) Foreign Application Priority Data

Dec. 20, 2023 (KR) ........................ 10-2023-0187287

(51) Int. Cl.
*H10F 39/00* (2025.01)

(52) U.S. Cl.
CPC ......... *H10F 39/811* (2025.01); *H10F 39/802* (2025.01)

(58) Field of Classification Search
CPC ..................................................... H10F 39/811
See application file for complete search history.

(56) References Cited

U.S. PATENT DOCUMENTS

| | | | | |
|---|---|---|---|---|
| 9,942,503 | B2 | 4/2018 | Velichko | |
| 11,264,378 | B2 | 3/2022 | Chen et al. | |
| 11,322,532 | B2 | 5/2022 | Meynants | |
| 11,574,940 | B2 | 2/2023 | Huang | |
| 11,627,267 | B2 | 4/2023 | Scott | |
| 2009/0128991 | A1 | 5/2009 | Mauritzson | |
| 2014/0042582 | A1* | 2/2014 | Kondo | H04N 25/79 257/443 |
| 2020/0105810 | A1* | 4/2020 | Moon | H10F 19/50 |
| 2022/0077216 | A1* | 3/2022 | Lim | H10F 39/199 |

FOREIGN PATENT DOCUMENTS

KR 10-0654040 B1 12/2006

* cited by examiner

*Primary Examiner* — Benjamin P Sandvik
(74) *Attorney, Agent, or Firm* — Morgan, Lewis & Bockius LLP

(57) ABSTRACT

An image sensor including: a substrate having a first surface and a second surface that are opposite to each other; a first capacitor disposed on the first surface, wherein the first capacitor includes a first lower electrode, a first dielectric layer, and a first upper electrode that are sequentially stacked; a second capacitor disposed on the first capacitor, wherein the second capacitor includes a second lower electrode, a second dielectric layer, and a second upper electrode that are sequentially stacked; and a first contact plug penetrating the first lower electrode, the first dielectric layer, the first upper electrode, the second lower electrode, the second dielectric layer and the second upper electrode and contacting both the first upper electrode and the second upper electrode.

20 Claims, 25 Drawing Sheets

IMAGE SENSOR INCLUDING STACKED CAPACITORS

CROSS-REFERENCE TO RELATED APPLICATION

This U.S. non-provisional patent application claims priority under 35 U.S.C. § 119 to Korean Patent Application No. 10-2023-0187287 filed on Dec. 20, 2023, in the Korean Intellectual Property Office, the disclosure of which is incorporated by reference herein in its entirety.

TECHNICAL FIELD

The inventive concept relates to an image sensor, and more particularly to an image sensor including stacked capacitors.

DISCUSSION OF RELATED ART

In semiconductor devices, an image sensor converts an optical image into an electric signal. Image sensors can be categorized into two types: a charge coupled device (CCD) and a complementary metal oxide semiconductor (CMOS). The CMOS image sensor, abbreviated as CIS, includes a plurality of two-dimensionally arranged pixels. Each of the plurality of pixels includes a photodiode, which converts incident light into an electric signal.

The image sensor may be used in a variety of devices, including cameras, mobile phones, and automobiles. To provide users with high-quality images or accurately represent subjects, the sensor may improve the dynamic range of images. The dynamic range refers to the range capable of expressing luminance from dark to bright portions in an image. Various methods are available to generate high dynamic range (HDR) images with improved dynamic range.

SUMMARY

An embodiment of the inventive concept provides a highly integrated image sensor that can realize clear image quality.

According to an embodiment of the inventive concept, there is provided an image sensor including: a substrate having a first surface and a second surface that are opposite to each other; a first capacitor disposed on the first surface, wherein the first capacitor includes a first lower electrode, a first dielectric layer, and a first upper electrode that are sequentially stacked; a second capacitor disposed on the first capacitor, wherein the second capacitor includes a second lower electrode, a second dielectric layer, and a second upper electrode that are sequentially stacked; and a first contact plug penetrating the first lower electrode, the first dielectric layer, the first upper electrode, the second lower electrode, the second dielectric layer and the second upper electrode and contacting both the first upper electrode and the second upper electrode.

According to an embodiment of the inventive concept, there is provided an image sensor including: a substrate having a first surface and a second surface that are opposite to each other; a first capacitor disposed on the first surface, wherein the first capacitor includes a first lower electrode, a first dielectric layer, and a first upper electrode that are sequentially stacked; a second capacitor disposed on the first capacitor, wherein the second capacitor includes a second lower electrode, a second dielectric layer, and a second upper electrode that are sequentially stacked; and a first contact plug that penetrates the first lower electrode, the first dielectric layer, the first upper electrode, the second lower electrode, the second dielectric layer, and the second upper electrode, and contacts the first lower electrode.

According to an embodiment of the inventive concept, there is provided an image sensor including: a substrate having a first surface and a second surface that are opposite to each other; a pixel separator disposed in the substrate and separating a first pixel and a second pixel; first and second photoelectric convertors respectively disposed in the first and second pixels; a first interlayer insulating layer covering the first surface; color filters on the second surface; micro lenses on the color filters; first lower electrodes disposed on the first interlayer insulating layer and overlapping the first and second pixels, respectively; first dielectric layers respectively disposed on the first lower electrodes; a first upper electrode disposed on the first dielectric layers and covering the first lower electrodes; a second interlayer insulating layer covering the first upper electrode; second lower electrodes disposed on the second interlayer insulating layer and overlapping the first and second pixels, respectively; second dielectric layers respectively disposed on the second lower electrodes; a second upper electrode disposed on the second dielectric layers and covering the second lower electrodes; and a first contact plug at each of the first and second pixels, the first contact plug penetrating the first lower electrode, the first dielectric layer, the first upper electrode, the second lower electrode, the second dielectric layer, the second upper electrode and contacting the first upper electrode and the second upper electrode.

DETAILED DESCRIPTION OF THE EMBODIMENTS

Hereinafter, to explain the inventive concept in more detail, embodiments of the inventive concept will be described with reference to the accompanying drawings.

Figure 1:
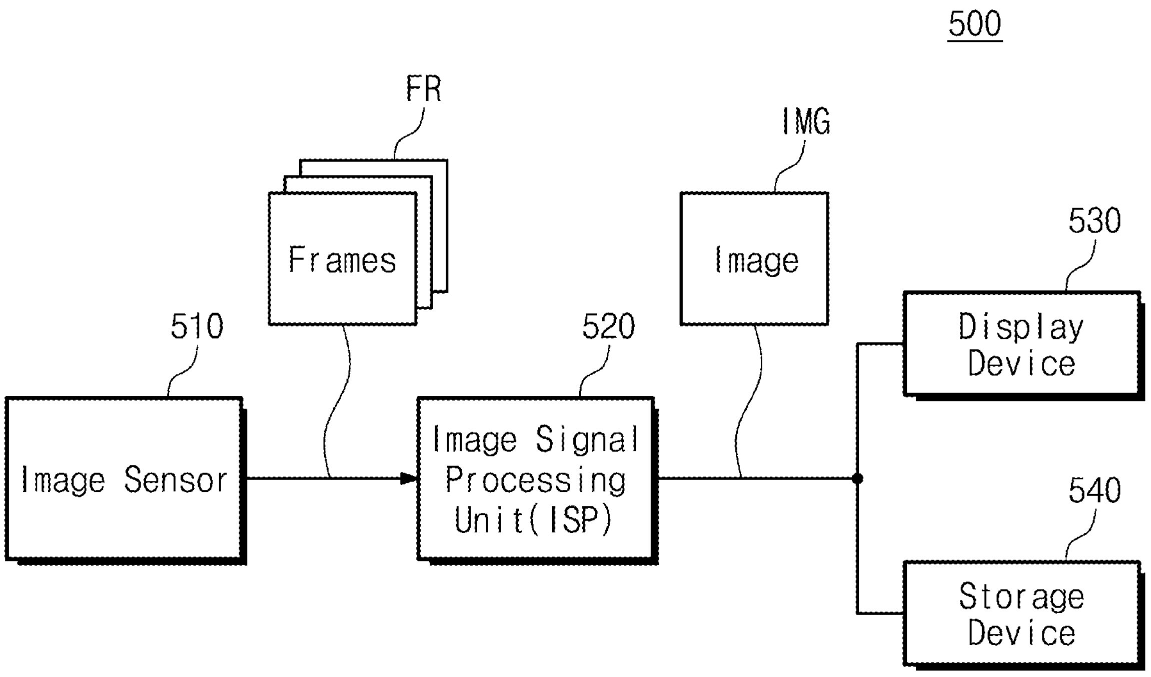
FIG. 1 is a block diagram showing an image processing device according to embodiments of the inventive concept.

FIG. 1 is a block diagram showing an image processing device according to embodiments of the inventive concept.

Referring to FIG. 1, an image processing device 500 may include an image sensor 510, an image signal processing unit (ISP) 520, a display device 530, and a storage device 540.

The image processing device 500 may be an electronic device that acquires external images, such as a smart phone or a digital camera.

The image sensor 510 may convert an image from an external object into an electrical signal or a data signal. The image sensor 510 may include a plurality of pixels. Each of the plurality of pixels may receive light reflected from an external object and convert the received light into an electrical image signal or a photo signal.

The image signal processing unit 520 may process frame data FR (e.g., image data or photo data) received from the image sensor 510 and output corrected image data IMG. The image signal processing unit 520 may perform color interpolation, color correction, gamma correction, color space conversion, or edge correction on the received frame data FR, to generate image data IMG.

The display device 530 may output image data IMG from the image signal processing unit 520, allowing a user to view and confirm it. For example, the display device 530 may include at least one of various display panels, such as a liquid crystal display panel, an organic light emitting display panel, an electrophoretic display panel, or an electrowetting display panel. The display device 530 may output image data IMG through the display panel.

The storage device 540 may be configured to store image data IMG from the image signal processing unit 520. The storage device 540 may include a volatile memory device such as static random access memory (SRAM), dynamic RAM (DRAM), and synchronous DRAM (SDRAM), or may include non-volatile memory device such as read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), and ferroelectric RAM (FRAM).

The image sensor 510 of the inventive concept may include a capacitor as a storage element, wherein the storage element is capable of storing electrical signals generated from a photoelectric convertor. A circuit diagram of the image sensor of the inventive concept is shown in FIG. 2, but the inventive concept is not limited thereto, and may be applied to any image sensor having a capacitor.

Figure 2:
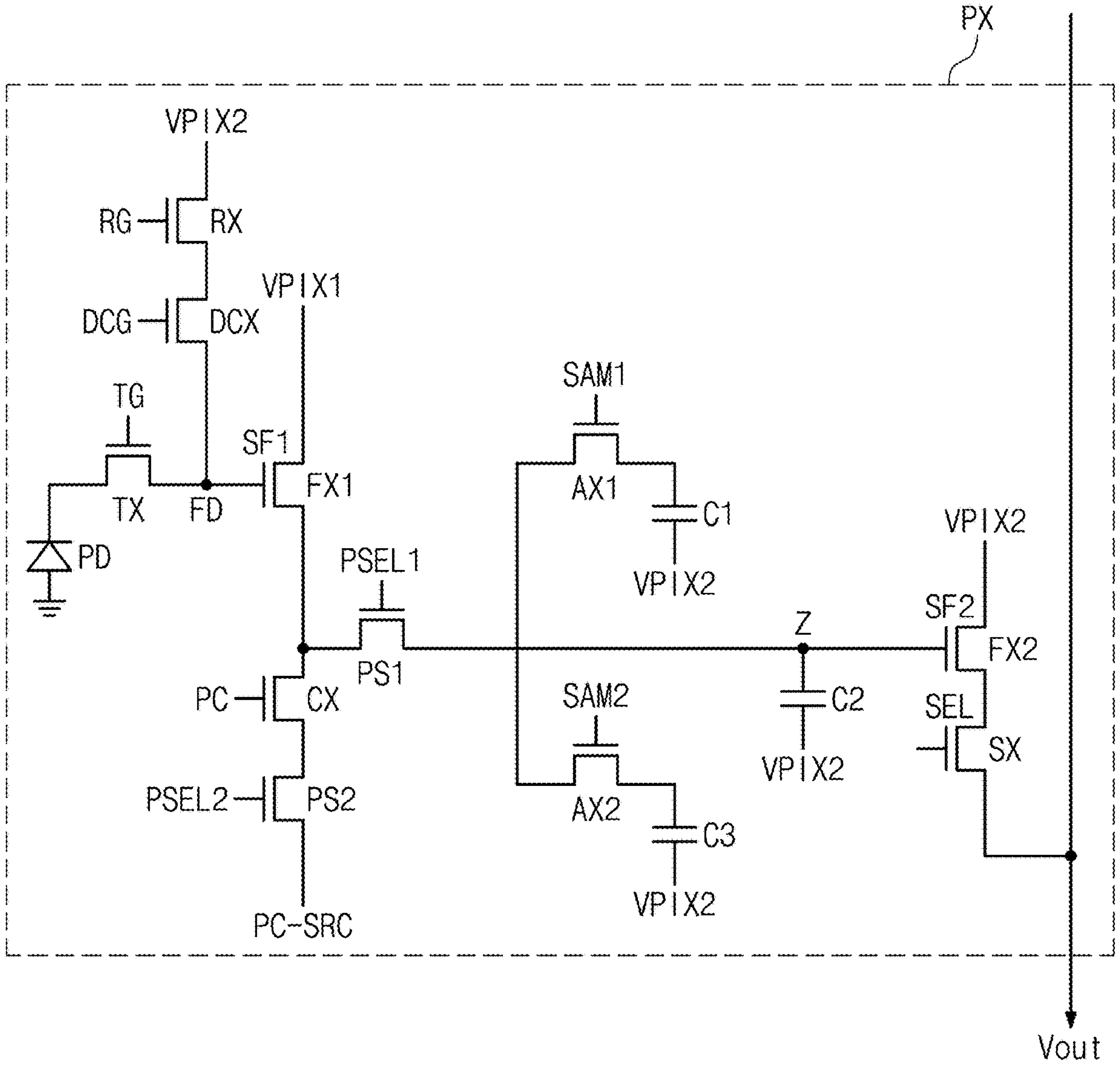
FIG. 2 is a circuit diagram of an image sensor according to embodiments of the inventive concept.

FIG. 2 is a circuit diagram of an image sensor according to embodiments of the inventive concept.

Referring to FIG. 2, an image sensor according to the present example may have an in-pixel cross-correlated double sampling (CDS) structure. For example, each unit pixel PX of the image sensor includes a photoelectric convertor PD, a transfer transistor TX including a transfer gate TG, a dual conversion transistor DCX including a dual conversion gate DCG, a reset transistor RX including a reset gate RG, a first source follower transistor FX1 including a first source follower gate SF1, a precharge transistor CX including a precharge gate PC, a first precharge selection transistor PS1 including a first precharge selection gate PSEL1, a second precharge selection transistor PS2 including a second precharge selection gate PSEL2, a first sampling transistor AX1 including a first sampling gate SAM1, a second sampling transistor AX2 including a second sampling gate SAM2, a second source follower transistor FX2 including a second source follower gate SF2, a selection transistor SX including a selection gate SEL, and first, second and third capacitors C1, C2, and C3.

The photoelectric convertor PD may be a photodiode including an N-type impurity region and a P-type impurity region. A first terminal of the transfer transistor TX may be connected to the photoelectric convertor PD. A second terminal of the transfer transistor TX may be a floating diffusion region FD. The floating diffusion region FD may be connected to a first terminal of the reset transistor RX. The floating diffusion region FD may be electrically connected to the first source follower gate SF1 of the first source follower transistor FX1.

A first terminal of the first source follower transistor FX1 is connected to the precharge transistor CX and the first precharge selection transistor PS1. A first terminal of the precharge transistor CX is connected to the second precharge selection transistor PS2. A first terminal of the second precharge selection transistor PS2 is connected to a precharge source line PC-SRC.

A first terminal of the first precharge selection transistor PS1 is connected to the first sampling transistor AX1 and the second sampling transistor AX2. The first capacitor C1 is connected to a first terminal of the first sampling transistor AX1. The second capacitor C2 is connected to a node Z between the first sampling transistor AX1 and the second sampling transistor AX2. The third capacitor C3 is connected to a first terminal of the second sampling transistor AX2. The node Z is connected to the second source follower gate SF2 of the second source follower transistor FX2.

A second terminal of the first source follower transistor FX1 may be connected to a first power voltage VPIX1 line. A second terminal of the reset transistor RX, upper electrodes UE1 to UE3 (e.g., FIG. 4A) of the first to third capacitors C1 to C3, and the second terminal of the first source follower transistor FX1 may be connected to a second power voltage VPIX2 line. A first terminal of the selection transistor SX may be connected to an output line Vout.

An operation of the image sensor in FIG. 2 may include sampling a reset value and sampling a signal value. Before light accumulation, the photoelectric convertor PD may be reset through the floating diffusion region FD. After the photoelectric convertor PD is reset, light accumulation (frame capture) begins, which can induce a noise component in the reset value. The reset value, including the noise component, may be stored in the first capacitor C1 through the first sampling transistor AX1.

Before starting the sampling step, the first to third capacitors C1 to C3 discharge their previously sampled voltage, allowing the first and second source follower transistors SF1 and SF2 to be precharged for sampling a new voltage. This precharge operation is performed using the precharge transistor CX and the first and second precharge selection transistors PSEL1 and PSEL2.

After the sampling step, charge may be transferred from the photoelectric convertor PD to the floating diffusion region FD, resulting in a new voltage (signal value) in the floating diffusion region FD. This signal value is then sampled to the third capacitor C3 through the second sampling transistor AX2. An accurate signal value, with noise components removed, may be obtained by subtracting the reset value stored in the first capacitor C1 from the signal value stored in the third capacitor C3, thus enabling the implementation of a clear image sensor. The reset value or signal value transmitted from the first capacitor C1 or the third capacitor C3 may be temporarily stored in the second capacitor C2.

The image sensor of the inventive concept may turn on or off the dual conversion transistor DCX depending on the amount of operating illuminance. This switching allows the full well capacitance of the corresponding pixel PX to change, thereby varying the conversion gain.

The image sensor according to embodiments of the inventive concept may operate in a global shutter mode. In this mode, electrical signals (data) generated from all pixels PX of the image sensor are sample and stored either simultaneously or sequentially. The image signal processing unit 520 of FIG. 1 sequentially reads the data by row, therefore allowing for the implementation of the global shutter mode. The image sensor of the inventive concept may also be referred to a voltage-type global shutter image sensor.

At least one transfer transistor TX may be disposed in each pixel PX. All or part of the other transistors RX, DCX, CX, FX1, FX2, PS1, PS2, AX1, AX2, and SX may be placed in each pixel PX, and adjacent pixels PX may be shared with each other.

Figure 3:
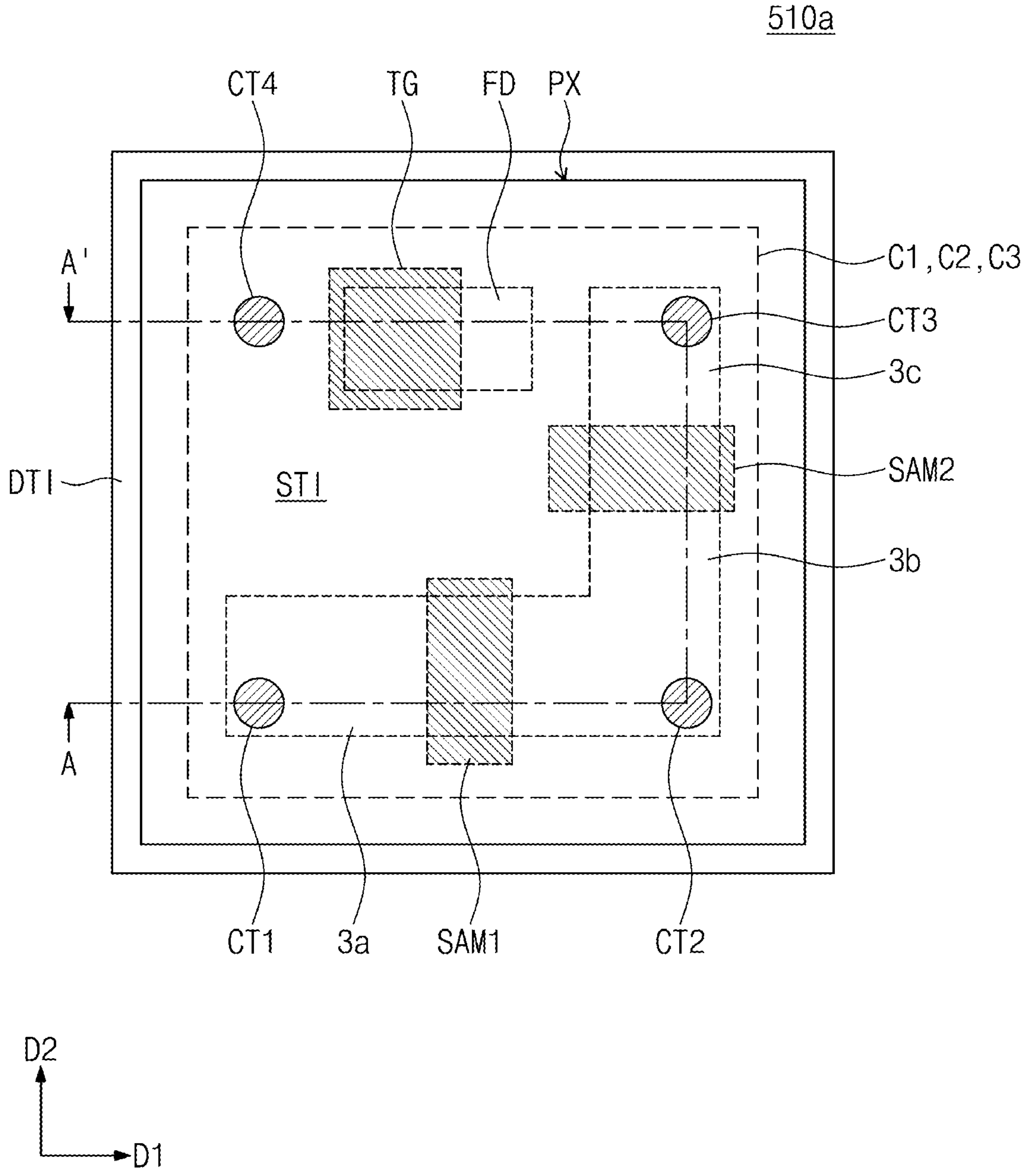
FIG. 3 is a top view of a pixel in an image sensor according to embodiments of the inventive concept.
Figure 4A:
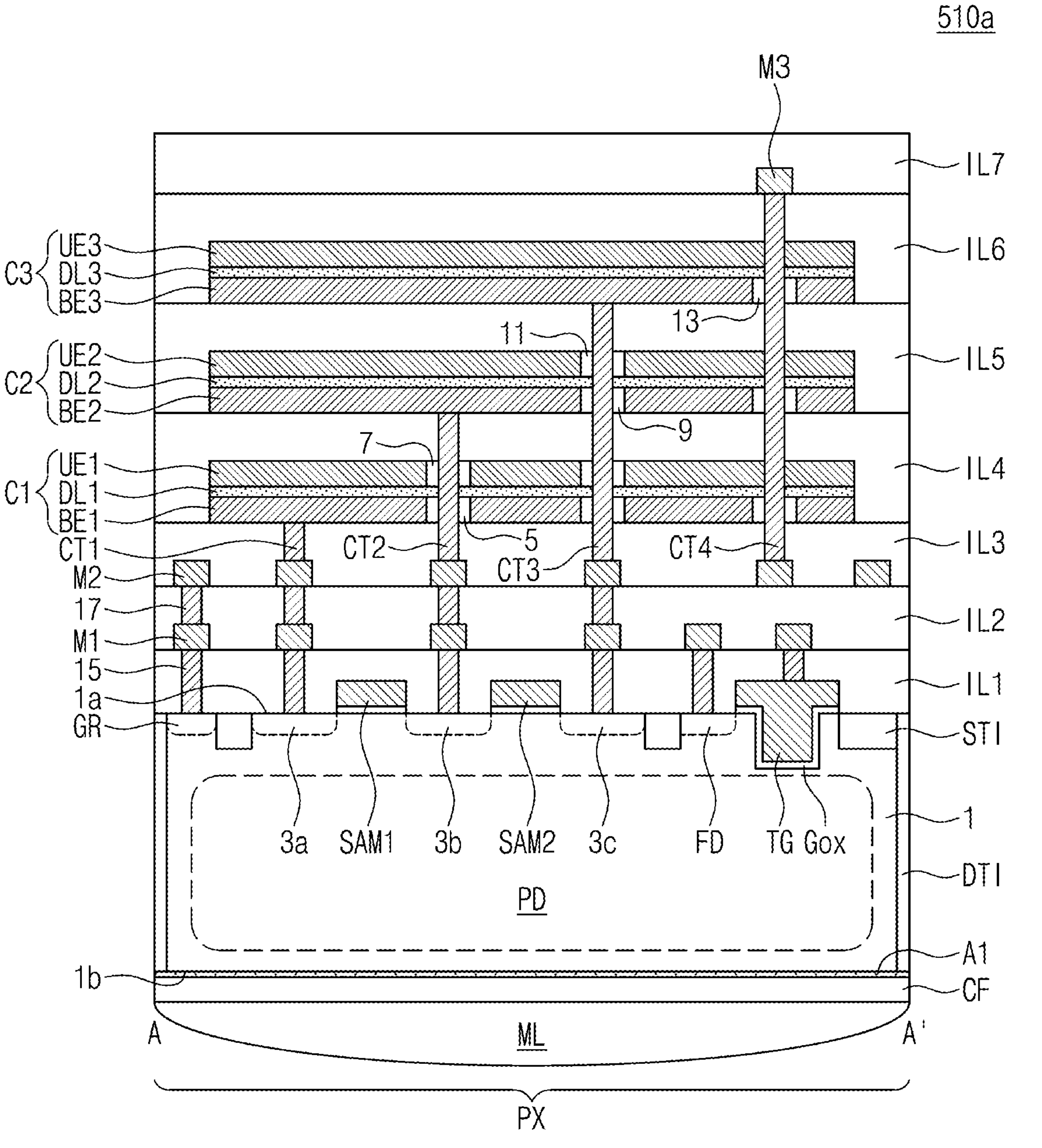
FIG. 4A is a cross-sectional view taken along line A-A' of FIG. 3 according to embodiments of the inventive concept.
Figure 4B:
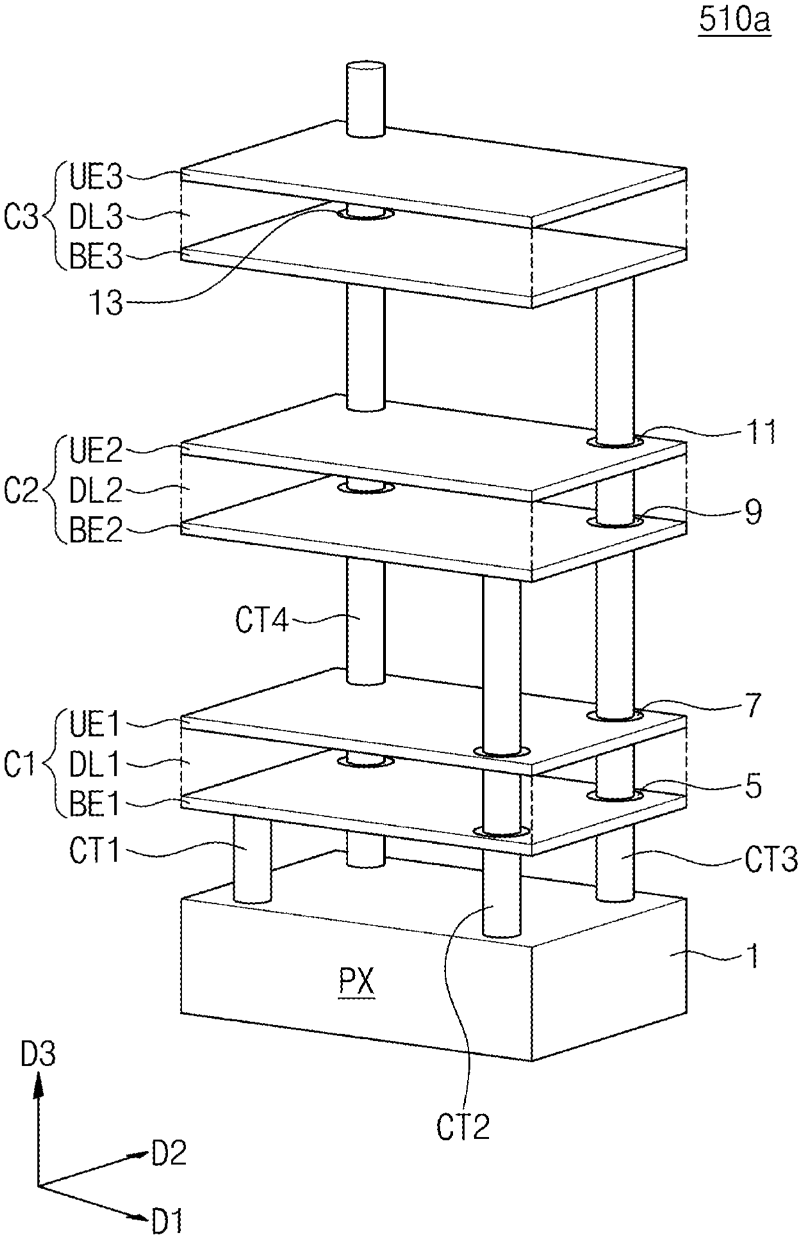
FIG. 4B is a schematic perspective view of the image sensor of FIG. 4A.

FIG. 3 is a top view of a pixel in an image sensor according to embodiments of the inventive concept. FIG. 4A is a cross-sectional view taken along line A-A' of FIG. 3 according to embodiments of the inventive concept. FIG. 4B is a schematic perspective view of the image sensor of FIG. 4A.

Referring to FIGS. 3, 4A, and 4B, an image sensor 510*a* according to the present example includes a first substrate 1. The first substrate 1 may be, for example, a silicon single crystal wafer, a silicon epitaxial layer, or a silicon on insulator (SOI) substrate. The first substrate 1 may be doped with, for example, an impurity of a first conductivity type. For example, the first conductivity type may be P type. The first substrate 1 includes a front surface 1*a* and a rear surface 1*b* that are opposite to each other. In this specification, the front surface 1*a* may be referred to as the first surface 1*a*, and the rear surface 1*b* may be referred to as the second surface 1*b*.

A pixel separator DTI is disposed on the first substrate 1 to separate the plurality of pixels PX. The pixels PX may be two-dimensionally arranged alternately in a first direction D1 and a second direction D2. In this example, each of the pixels PX may have a square or rectangular shape. The pixel separator DTI may penetrate the first substrate 1. The pixel separator DTI may include a conductive pattern 14 (e.g., FIG. 18), an insulating liner pattern 16 (e.g., FIG. 18) surrounding the conductive pattern, and a buried electrode insulation pattern 12 (e.g., FIG. 18) below the conductive pattern 14 (e.g., FIG. 18).

In each of the pixels PX, photoelectric convertors PD may be disposed in the first substrate 1. The photoelectric convertors PD may be doped with impurities of a second conductivity type opposite that of the first conductivity type. The second conductivity type may be, for example, N-type. The N-type impurity doped in the photoelectric convertor PD may form a PN junction with the P-type impurity doped in the surrounding first substrate 1 to create a photodiode.

Device isolators STI adjacent to the front surface 1*a* may be disposed in the first substrate 1. The device isolators STI may be penetrated by the pixel separator DTI. The device isolators STI may define active regions adjacent to the front surface 1*a* in each pixel PX. The active regions may be provided for the transistors TX, RX, DCX, CX, FX1, FX2, PS1, PS2, AX1, AX2, and SX of FIG. 2.

FIGS. 3 and 4A show the transmission transistor TX including the transmission gate TG and the first and second sampling transistors AX1 and AX2 including the first and second sampling gates SAM1 and SAM2, but the other transistors RX, DCX, CX, FX1, FX2, PS1, PS2, and SX are omitted. In the perspective view of FIG. 4B, the transistors TX, RX, DCX, CX, FX1, FX2, PS1, PS2, AX1, AX2, and SX are also omitted.

Referring to FIGS. 3 and 4A, the transfer gate TG may be disposed on the front surface 1*a* of the first substrate 1 in each pixel PX. A portion of the transfer gate TG may extend into the first substrate 1. The transmission gate TG may be a vertical type. Alternatively, the transfer gate TG may be a planar type that does not extend into the first substrate 1 and is flat. A gate insulating layer Gox may be interposed between the transfer gate TG and the first substrate 1. A floating diffusion region FD may be disposed in the first substrate 1 adjacent to one side of the transfer gate TG. For example, the floating diffusion region FD may be doped with impurities of the second conductivity type.

The image sensor 510*a* may be a rear light-receiving image sensor. Light may enter the first substrate 1 through the rear surface 1*b* of the first substrate 1. Electron-hole pairs may be created at a PN junction by the incident light. Electrons generated are then moved to the photoelectric convertor PD. When a voltage is applied to the transfer gate TG, the electrons move to the floating diffusion region FD.

Referring to FIGS. 3 and 4A, a first sampling gate SAM1 and a second sampling gate SAM2 may be disposed on the front surface 1*a* of the first substrate 1. The gate insulating layer Gox is disposed below the first sampling gate SAM1 and the second sampling gate SAM2, respectively. A first impurity region 3*a* may be disposed on a left side of the first sampling gate SAM1. A third impurity region 3*c* may be disposed on a right side of the second sampling gate SAM2. A second impurity region 3*b* may be disposed between the first sampling gate SAM1 and the second sampling gate SAM2. The first to third impurity regions 3*a*, 3*b*, and 3*c* may be doped with impurities of the second conductivity type.

A ground region GR is disposed in the first substrate 1. The ground region GR may be doped with impurities of the first conductivity type at a higher concentration than those in the first substrate 1.

The front surface 1*a* of the first substrate 1 may be covered with a first interlayer insulating layer ILL. First lower contact plugs 15 may penetrate the first interlayer insulating layer IL1 and may be connected to the ground region GR, the first to third impurity regions 3*a*, 3*b*, and 3*c*, the floating diffusion region FD, and the transmission gate TG. First wirings M1 may be disposed on the first interlayer insulating layer ILL. The first wirings M1 may be covered with a second interlayer insulating layer IL2. Second lower contact plugs 17 may penetrate the second interlayer insulating layer IL2 and may be connected to some of the first wirings M1. In other words, a first portion of the second lower contact plugs 17 may be connected to the first wirings M1 and a second portion of the second lower contact plugs 17 may not be connected to the first wirings M1. Second wirings M2 are disposed on the second interlayer insulating layer IL2. The second wirings M2 may be covered with a third interlayer insulating layer IL3.

A first capacitor C1 may be disposed on the third interlayer insulating layer IL3. The first capacitor C1 may include a first lower electrode BE1, a first dielectric layer DL1, and a first upper electrode UE1 that are sequentially stacked. The first capacitor C1 is covered with a fourth interlayer insulating layer IL4.

A second capacitor C2 may be disposed on the fourth interlayer insulating layer IL4. The second capacitor C2 may include a second lower electrode BE2, a second dielectric layer DL2, and a second upper electrode UE2 that are sequentially stacked. The second capacitor C2 is covered with a fifth interlayer insulating layer IL5.

A third capacitor C3 may be disposed on the fifth interlayer insulating layer IL5. The third capacitor C3 may include a third lower electrode BE3, a third dielectric layer DL3, and a third upper electrode UE3 that are sequentially stacked. The third capacitor C3 is covered with a sixth interlayer insulating layer IL6. A third wiring M3 is disposed on the sixth interlayer insulating layer IL6. The sixth interlayer insulating layer IL6 and the third wiring M3 are covered with a seventh interlayer insulating layer IL7.

Referring to FIGS. 3, 4A, and 4B, the first to third capacitors C1, C2, and C3 may be disposed on one pixel PX and may vertically overlap each other. For example, the first to third capacitors C1, C2 and C3 may overlap each other in a third direction D3. A first contact plug CT1 may be electrically connected to the first lower electrode BE1 of the first capacitor C1. The first contact plug CT1 may penetrate the third interlayer insulating layer IL3 and may be in contact with a lower surface of the first lower electrode BE1. The first contact plug CT1 may be connected with a second wiring M2. The first contact plug CT1 may connect the first lower electrode BE1 to the first impurity region 3*a*.

A second contact plug CT2 may be electrically connected to the second lower electrode BE2 of the second capacitor C2. The second contact plug CT2 may penetrate the third interlayer insulating layer IL3, the first lower electrode BE1, the first dielectric layer DL1, the first upper electrode UE1, and the fourth interlayer insulating layer IL4 and may be in contact with a lower surface of the lower electrode BE2. For example, the second contact plug CT2 may pass through the first capacitor C1. The second contact plug CT2 may be insulated from the first lower electrode BE1 and the first upper electrode UE1. A first electrode insulation pattern 5 may be disposed between the second contact plug CT2 and the first lower electrode BE1. A second electrode insulation pattern 7 may be disposed between the second contact plug CT2 and the first upper electrode UE1. The first electrode insulation pattern 5 and the second electrode insulation pattern 7 may surround the second contact plug CT2. The second contact plug CT2 may connect the second lower electrode BE2 to the second impurity region 3*b*.

A third contact plug CT3 may be electrically connected to the third lower electrode BE3 of the third capacitor C3. The third contact plug CT3 may penetrate the third interlayer insulating layer IL3, the first lower electrode BE1, the first dielectric layer DL1, the first upper electrode UE1, the fourth interlayer insulating layer IL4, and the second lower electrode BE2, the second dielectric layer DL2, the second upper electrode UE2, and the fifth interlayer insulating layer IL5 and may be in contact with a lower surface of the third lower electrode BE3. For example, the third contact plug CT3 may penetrate the first and second capacitors C1 and C2. The third contact plug CT3 may be insulated from the first lower electrode BE1, the first upper electrode UE1, the second lower electrode BE2, and the second upper electrode UE2. A first electrode insulation pattern 5 may be disposed between the third contact plug CT3 and the first lower electrode BE1. A second electrode insulation pattern 7 may be disposed between the third contact plug CT3 and the first upper electrode UE1. A third electrode insulation pattern 9 may be disposed between the third contact plug CT3 and the second lower electrode BE2. A fourth electrode insulation pattern 11 may be disposed between the third contact plug CT3 and the second upper electrode UE2. The first electrode insulation pattern 5, the second electrode insulation pattern 7, the third electrode insulation pattern 9, and the fourth electrode insulation pattern 11 may surround the third contact plug CT3. The third contact plug CT3 may connect the third lower electrode BE3 to the third impurity region 3*c*.

A fourth contact plug CT4 may be electrically connected to the upper electrodes UE1, UE2, and UE3 of the first to third capacitors C1 to C3, respectively. The second power voltage VPIX2 of FIG. 2 may be applied to the upper electrodes UE1, UE2, and UE3 through the fourth contact plug CT4. The fourth contact plug CT4 may penetrate the third interlayer insulating layer IL3, the first lower electrode BE1, the first dielectric layer DL1, the first upper electrode UE1, the fourth interlayer insulating layer IL4, the second lower electrode BE2, the second dielectric layer DL2, the second upper electrode UE2, the fifth interlayer insulating layer IL5, the third lower electrode BE3, the third dielectric layer DL3, the third upper electrode UE3, and the sixth interlayer insulating layer IL6. For example, the fourth contact plug CT4 may penetrate the first to third capacitors C1 to C3. The fourth contact plug CT4 may be in contact with the upper electrodes UE1, UE2, and UE3 of the first to third capacitors C1 to C3, respectively. The fourth contact plug CT4 may be insulated from the lower electrodes BE1, BE2, and BE3 of the first to third capacitors C1 to C3. The first electrode insulation pattern 5 may be interposed between the fourth contact plug CT4 and the first lower electrode BE1. The third electrode insulation pattern 9 may be interposed between the fourth contact plug CT4 and the second lower electrode BE2. A fifth electrode insulation pattern 13 may be interposed between the fourth contact plug CT4 and the third lower electrode BE3. The first electrode insulation pattern 5, the third electrode insulation pattern 9, and the fifth electrode insulation pattern 13 may surround the fourth contact plug CT4.

Each of the first to third capacitors C1 to C3 may be a metal-insulator-metal (MIM) type capacitor. The first to third lower electrodes BE1, BE2, and BE3 may include the same or different materials and may have the same or different thickness. Each of the first to third upper electrodes UE1, UE2, and UE3 may include the same or different materials and may have the same or different thickness. Each of the first to third dielectric layers DL1, DL2, and DL3 may include the same or different materials and may have the same or different thickness. Each of the first to third capacitors C1 to C3 may have the same or different capacitances depending on materials and thicknesses of the first to third lower electrodes BE1, BE2, and BE3, the first to third upper electrodes UE1, UE2, and UE3, and the first to third dielectric layers DL1, DL2, and DL3.

Each of the first and second lower contact plugs 15 and 17, the first to fourth contact plugs CT1, CT2, CT3, and CT4, the first to third lower electrodes BE1, BE2, and BE3, the first to third upper electrodes UE1, UE2, and UE3 may include at least one of impurity-doped polysilicon, aluminum, copper, tungsten, ruthenium, rhodium, titanium, tantalum, titanium nitride, and tantalum nitride, independently. Each of the first to seventh interlayer insulating layers IL1 to IL7 and the first to fifth electrode insulation patterns 5, 7, 9, 11, and 13 may have a single-layer or multi-layer structure of at least one of silicon oxide, silicon nitride, silicon oxynitride, SiCN, or a porous insulating material. The first to third dielectric layers DL1, DL2, and DL3 may have a single-layer or multi-layer structure of at least one of, for example, aluminum oxide, hafnium oxide, iridium oxide, and ruthenium oxide.

When viewed in a plan view, the first to fourth contact plugs CT1 to CT4 may be arranged clockwise. The first to fourth contact plugs CT1 to CT4 may be adjacent to corners of one pixel PX, respectively. For example, in FIG. 3 the first contact plug CT1 is located at a bottom left corner of the pixel PX.

In the inventive concept, a plurality of capacitors C1 to C3 may be stacked on one pixel PX. This allows most of the area of each pixel PX to be allocated to these capacitors C1 to C3, thereby increasing their capacitance. Additionally, since the contact plugs penetrate the capacitors, there is no need to secure a separate space for the contact plugs. This design enhances image quality with improved high dynamic range (HDR) characteristics and provides a highly integrated image sensor capable of being operated in global shutter mode.

The first to third capacitors C1 to C3 may function as a reflector that reflects light entering through the second surface 1*b* of the first substrate 1. This light exits through the first to seventh interlayer insulating layers IL1 to IL7 and re-enters the photoelectric convertor PD.

The rear surface 1*a* of the first substrate 1 may be covered with a fixed charge layer A1. The fixed charge layer A1 may be in contact with the rear surface 1*a*. The fixed charge layer A1 may have a negative fixed charge. The fixed charge layer A1 may be formed of a metal oxide or a metal fluoride including at least one metal selected from the group consisting of hafnium (Hf), zirconium (Zr), aluminum (Al), tantalum (Ta), titanium (Ti), yttrium, and lanthanoid. For example, the fixed charge layer A1 may be a hafnium oxide layer or an aluminum oxide layer. In this case, hole accumulation may occur around the fixed charge layer A1. As a result, the occurrence of dark current and white spots may be effectively reduced.

Color filters CF may be disposed on the fixed charge layer A1. The color filters CF may be arranged in a bayer pattern, a 2×2 array of tetra patterns, a 3×3 array of nona patterns, or a 4×4 array of hexadeca patterns. Micro lenses ML may be disposed on the color filters CF, respectively.

Figure 5A:
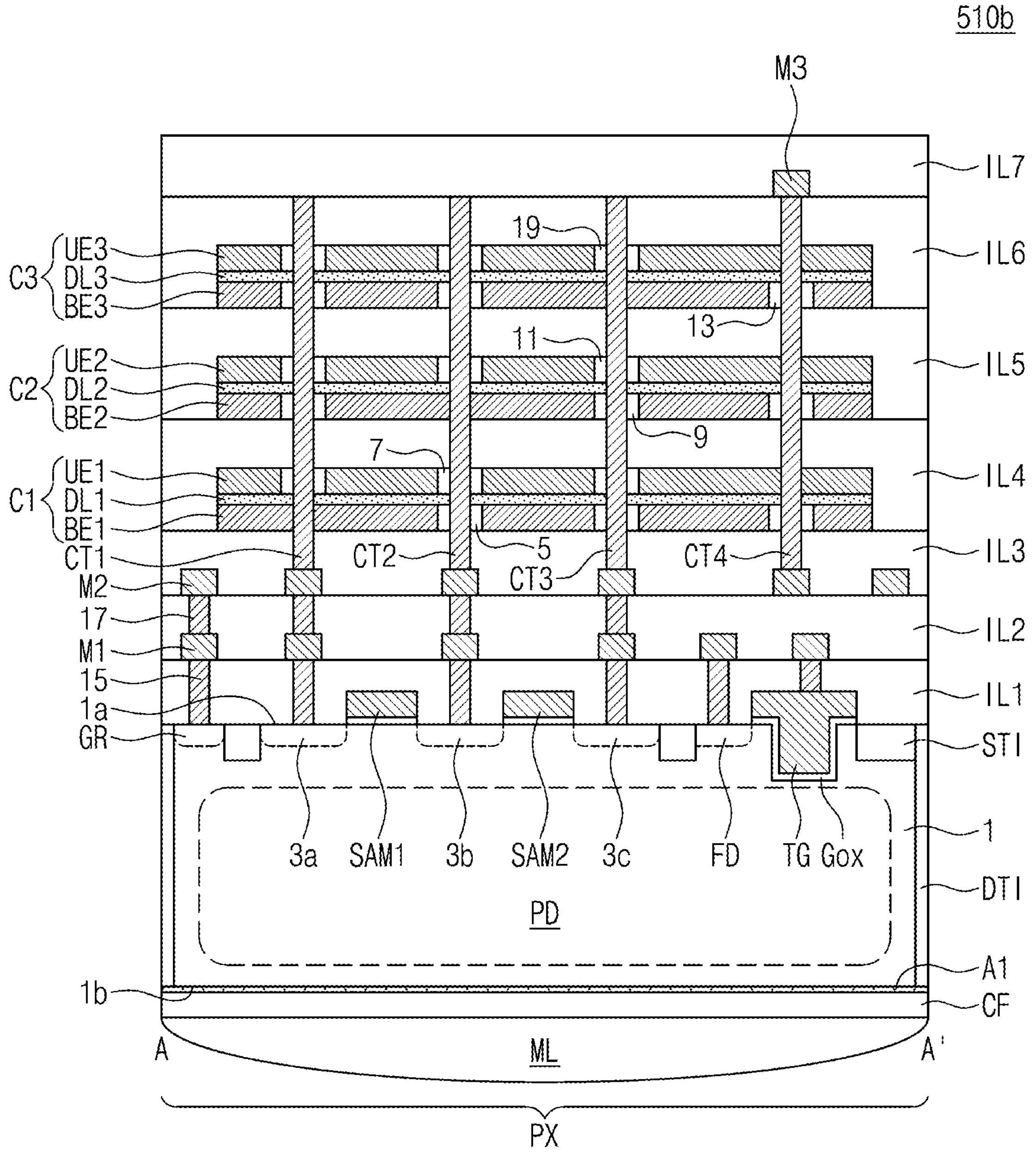
FIG. 5A is a cross-sectional view taken along line A-A' of FIG. 3 according to embodiments of the inventive concept.
Figure 5B:
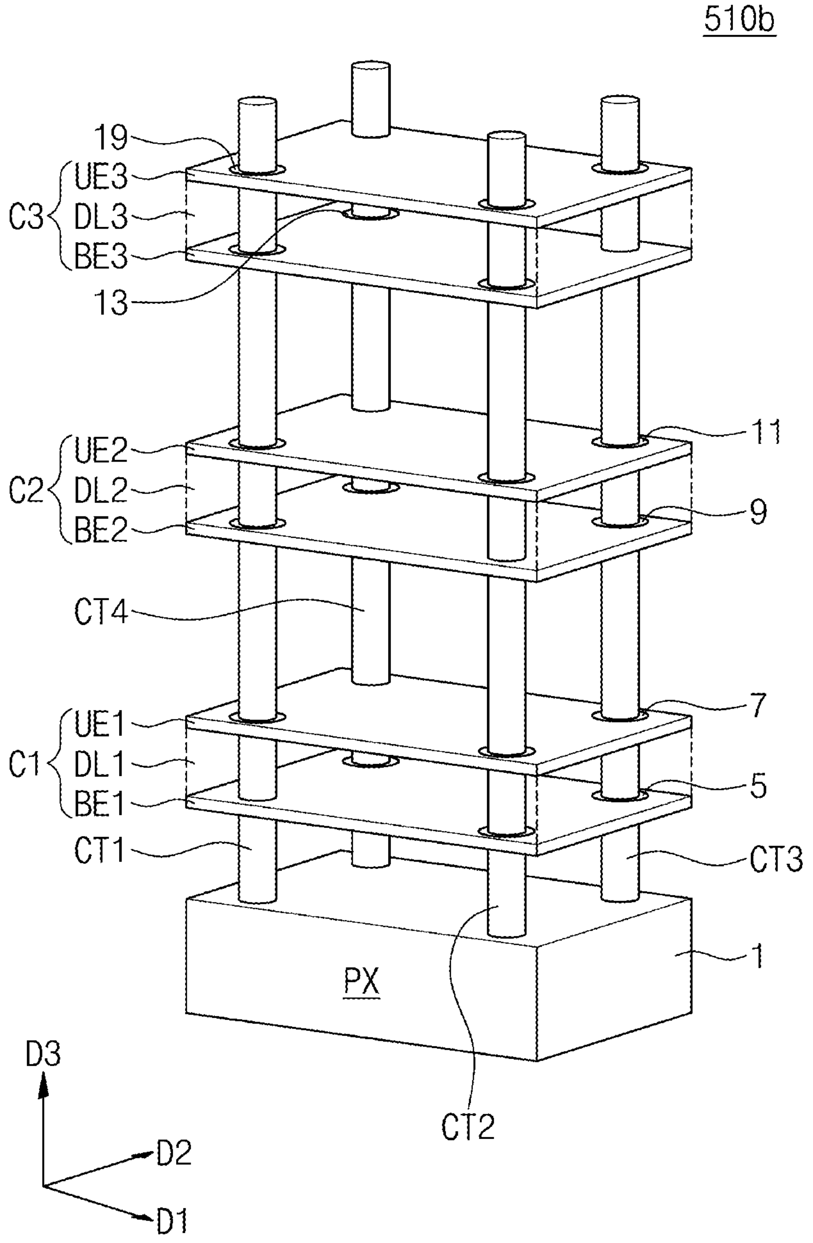
FIG. 5B is a schematic perspective view of the image sensor of FIG. 5A.

FIG. 5A is a cross-sectional view taken along line A-A' of FIG. 3 according to embodiments of the inventive concept. FIG. 5B is a schematic perspective view of the image sensor of FIG. 5A.

Referring to FIGS. 5A and 5B, in an image sensor 510*b* according to the present example, all of the first to fourth contact plugs CT1 to CT4 may penetrate a third interlayer insulating layer IL3, a first lower electrode BE1, a first dielectric layer DL1, a first upper electrode UE1, a fourth interlayer insulating layer IL4, a second lower electrode BE2, a second dielectric layer DL2, a second upper electrode UE2, a fifth interlayer insulating layer IL5, a third lower electrode BE3, a third dielectric layer DL3, a third upper electrode UE3, and a sixth interlayer insulating layer IL6. Each of the first to fourth contact plugs CT1 to CT4 may have the same height.

The first contact plug CT1 may be in contact with a side surface of the first lower electrode BE1, but may be isolated from the first upper electrode UE1, the second lower electrode BE2, the second upper electrode UE2, the third lower electrode BE3, and the third upper electrode UE3. A second electrode insulation pattern 7 may be interposed between the first contact plug CT1 and the first upper electrode UE1, and a third electrode insulation pattern 9 may be interposed between the first contact plug CT1 and the second lower electrode BE2, a fourth electrode insulation pattern 11 may be interposed between the first contact plug CT1 and the second upper electrode UE2, a fifth electrode insulation pattern 13 may be interposed between the first contact plug CT1 and the third lower electrode BE3, and a sixth electrode insulation pattern 19 may be interposed between the first contact plug CT1 and the third upper electrode UE3.

The second contact plug CT2 may be in contact with the side surface of the second lower electrode BE2, but may be isolated from the first lower electrode BE1, the first upper electrode UE1, the second upper electrode UE2, the third lower electrode BE3, and the third upper electrode UE3. A first electrode insulation pattern 5 may be interposed between the second contact plug CT2 and the first lower electrode BE1, and a second electrode insulation pattern 7 may be interposed between the second contact plug CT2 and the first upper electrode UE1, a fourth electrode insulation pattern 11 may be interposed between the second contact plug CT2 and the second upper electrode UE2, a fifth electrode insulation pattern 13 may be interposed between the second contact plug CT2 and the third lower electrode BE3, and a sixth electrode insulation pattern 19 may be interposed between the second contact plug CT2 and the third upper electrode UE3.

The third contact plug CT3 may be in contact with the side surface of the third lower electrode BE3, but may be isolated from the first lower electrode BE1, the first upper electrode UE1, the second lower electrode BE2, the second upper electrode UE2, and the third upper electrode UE3. A first electrode insulation pattern 5 may be interposed between the third contact plug CT3 and the first lower electrode BE1, a second electrode insulation pattern 7 may be interposed between the third contact plug CT3 and the first upper electrode UE1, a third electrode insulation pattern 9 may be interposed between the third contact plug CT3 and the second lower electrode BE2, a fourth electrode insulation pattern 11 may be interposed between the third contact plug CT3 and the second upper electrode UE2, and a sixth electrode insulation pattern 19 may be interposed between the third contact plug CT3 and the third upper electrode UE3. Other structures may be the same/similar to those described above.

Figure 6:
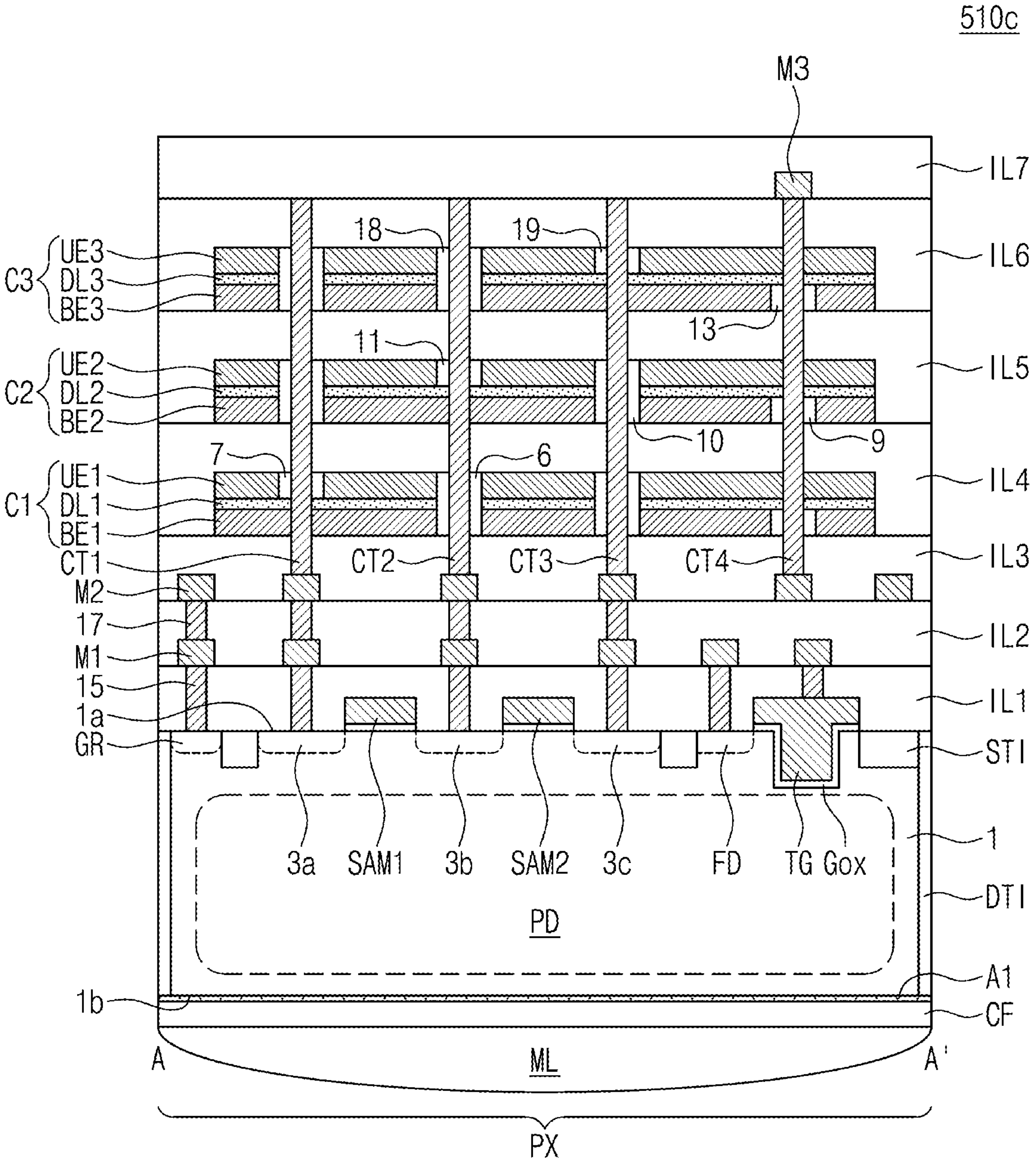
FIG. 6 is a cross-sectional view taken along line A-A' of FIG. 3 according to embodiments of the inventive concept.

FIG. 6 is a cross-sectional view taken along line A-A' of FIG. 3 according to embodiments of the inventive concept.

Referring to FIG. 6, an image sensor 510*c* according to the present example includes first, second and third capacitor insulation patterns 6, 10, and 18. The first capacitor insulating pattern 6 penetrates the first capacitor C1 and surrounds the second contact plug CT2 and the third contact plug CT3, respectively. The second capacitor insulation pattern 10 penetrates the second capacitor C2 and surrounds the first contact plug CT1 and the third contact plug CT3, respectively. The third capacitor insulation pattern 18 penetrates the third capacitor C3 and surrounds the first contact plug CT1 and the second contact plug CT2, respectively. Other structures may be the same/similar to those described with reference to FIGS. 5A and 5B.

Figure 7A:
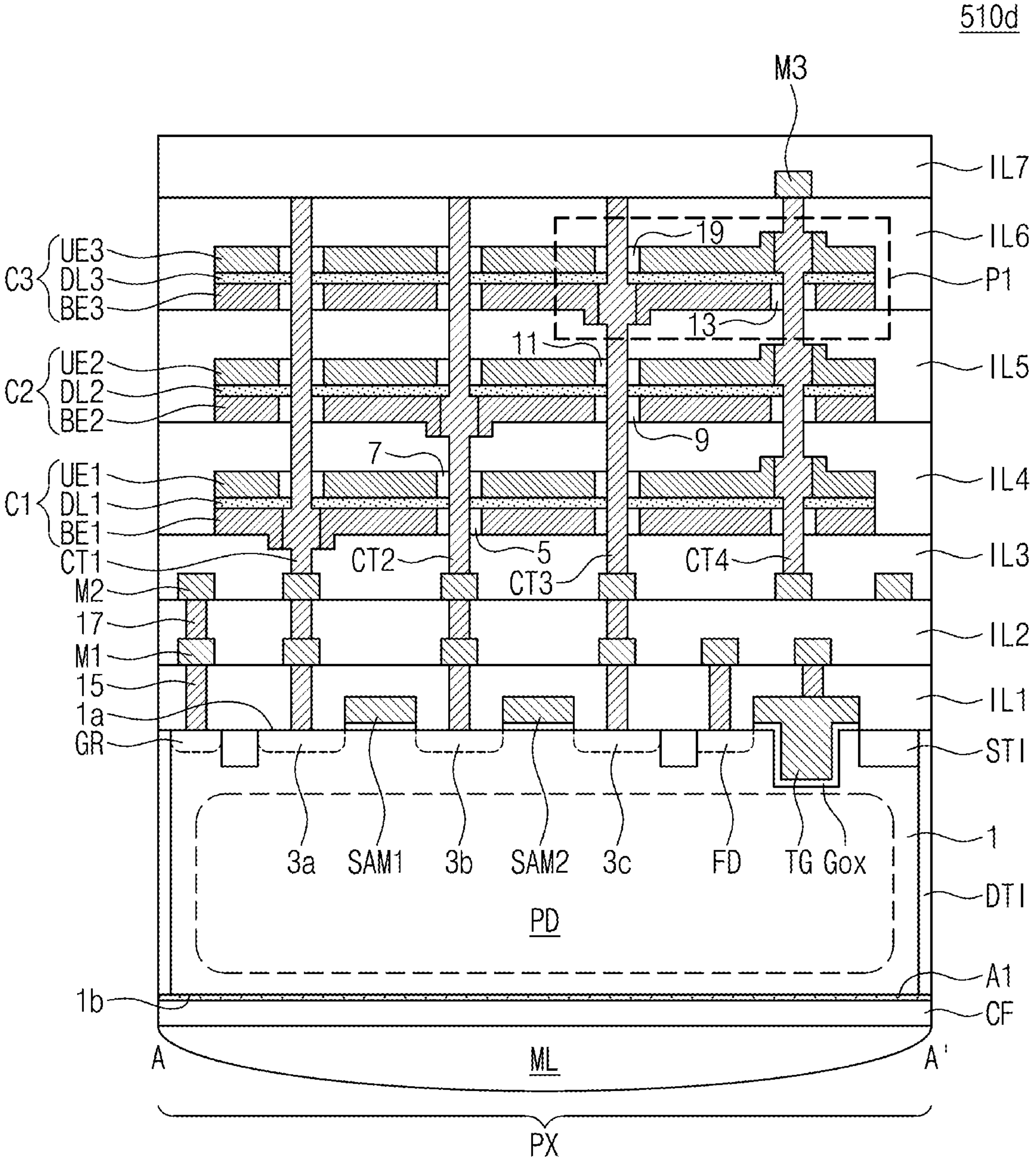
FIG. 7A is a cross-sectional view taken along line A-A' of FIG. 3 according to embodiments of the inventive concept.
Figure 7B:
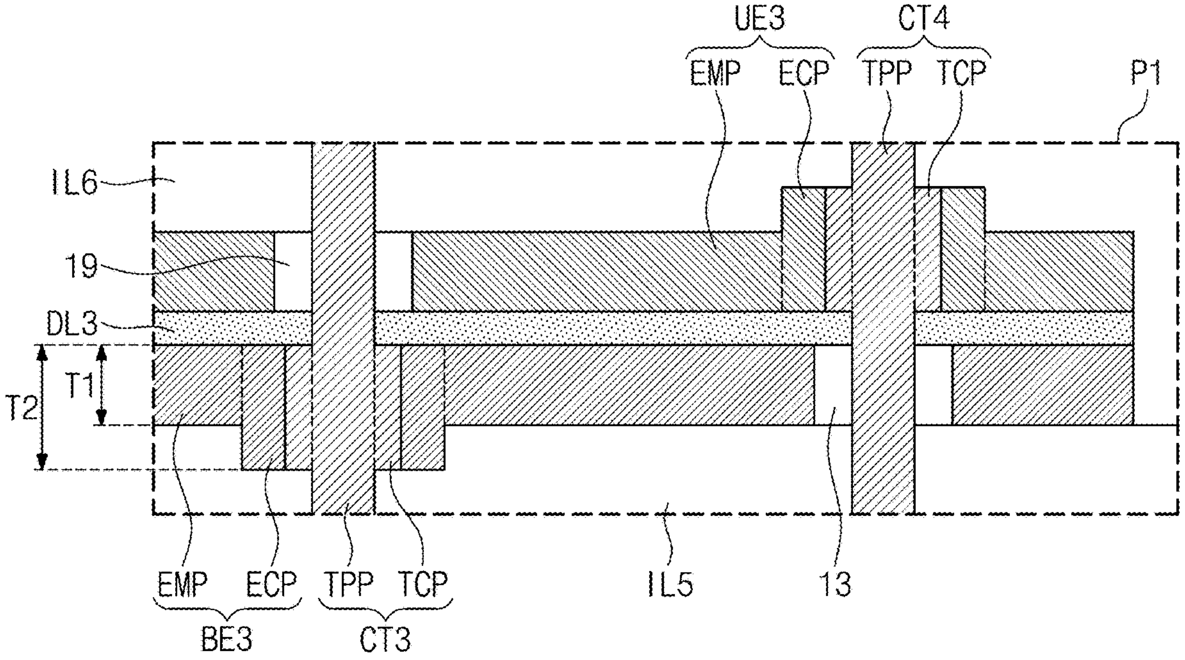
FIG. 7B is an enlarged view of portion 'P1' of FIG. 7A.

FIG. 7A is a cross-sectional view taken along line A-A' of FIG. 3 according to embodiments of the inventive concept. FIG. 7B is an enlarged view of portion 'P1' of FIG. 7A.

Referring to FIGS. 7A and 7B, each of first to fourth contact plugs CT1 to CT4 may include a contact pillar TPP and a contact joint TCP protruding laterally from a side surface thereof. The contact joint TCP may have a pillar shape surrounding the contact pillar TPP. Each of the first to third contact plugs CT1 to CT3 may include one contact joint TCP that is in contact with a corresponding one of the first to third lower electrodes BE1 to BE3. For example, the contact joint TCP of the first contact plug CT1 may be in contact with the first lower electrode BE1, and the contact joint TCP of the second contact plug CT2 may be in contact with the second lower electrode BE2. The fourth contact plug CT4 may include three contact joints TCP in contact with the first to third upper electrodes UE1 to UE3.

Each of the first to third lower electrodes BE1 to BE3 and the first to third upper electrodes UE1 to UE3 may include an electrode main portion EMP and an electrode joint ECP. The electrode joint ECP of each of the first to third lower electrodes BE1 to BE3 and the first to third upper electrodes UE1 to UE3 may be in contact with the contact joint TCP of the corresponding one of the first to fourth contact plugs CT1 to CT4. For example, the electrode joint ECP of the third lower electrode BE3 may be in contact with the contact joint TCP of the third contact plug CT3. The electrode main portion EMP may have a first thickness T1. The electrode joint ECP may have a second thickness T2 greater than the first thickness T1. The contact joint TCP may have the second thickness T2. Other structures may be the same/similar to those described with reference to FIGS. 5A and 5B.

Figure 8:
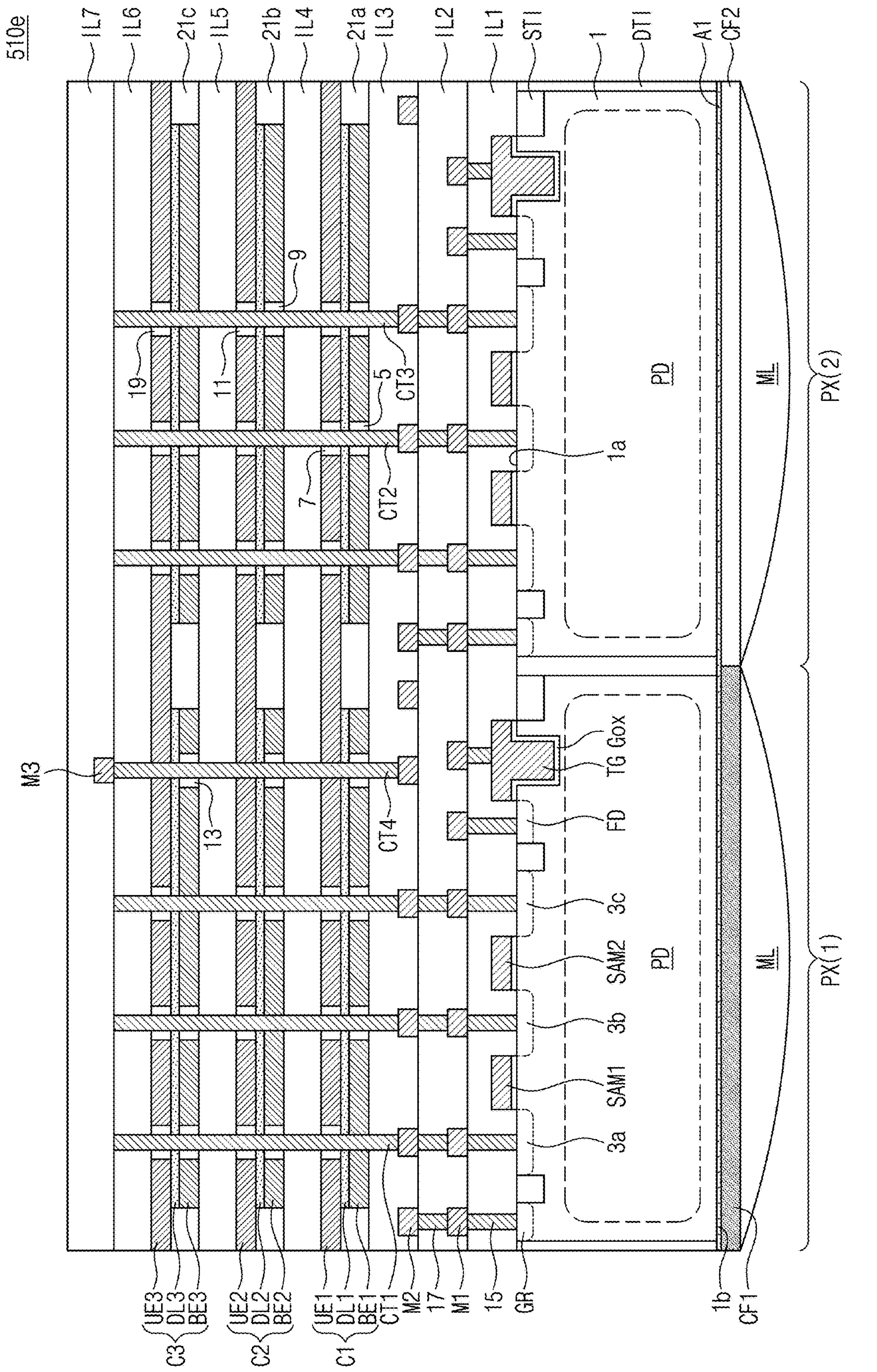
FIG. 8 is a cross-sectional view of an image sensor according to embodiments of the inventive concept.

FIG. 8 is a cross-sectional view of an image sensor according to embodiments of the inventive concept.

Referring to FIG. 8, a pixel separator DTI is disposed in the first substrate 1 to separate a plurality of pixels PX from each other. The pixels PX may include a first pixel PX(1) and a second pixel PX(2) that are adjacent to each other. In each of the pixels PX, first to third lower electrodes BE1 to BE3 may be stacked and disposed on the front surface 1*a* of the first substrate 1.

The first to third lower electrodes BE1 to BE3 on the first pixel PX(1) may be spaced apart from the first to third lower electrodes BE1 to BE3 on the second pixel PX(2). A first electrode separation pattern 21*a* may be interposed between adjacent first lower electrodes BE1. A second electrode separation pattern 21*b* may be interposed between adjacent second lower electrodes BE2. A third electrode separation pattern 21*c* may be interposed between adjacent third lower electrodes BE3. The first to third electrode separation patterns 21*a* to 21*c* may have a single-layer or multi-layer structure of at least one of silicon oxide, silicon nitride, silicon oxynitride, and a porous insulating material.

The first upper electrode UE1, the second upper electrode UE2, and the third upper electrode UE3 may extend laterally to cover the first and second pixels PX(1) and PX(2). The first upper electrode UE1, the second upper electrode UE2, and the third upper electrode UE3 may overlap the first to third electrode separation patterns 21*a* to 21*c*. The fourth contact plug CT4 may be in contact with the first upper electrode UE1, the second upper electrode UE2, and the third upper electrode UE3 on the first pixel PX(1). The fourth contact plug CT4 is not disposed on the second pixel PX(2). The rear surface 1*b* of the first pixel PX(1) may be covered with a first color filter CF1. The rear surface 1*b* of the second pixel PX(2) may be covered with a second color filter CF2. The second color filter CF2 may have a different color from the first color filter CF1. Other structures may be the same/similar to those described with reference to FIGS. 5A and 5B.

Figure 9:
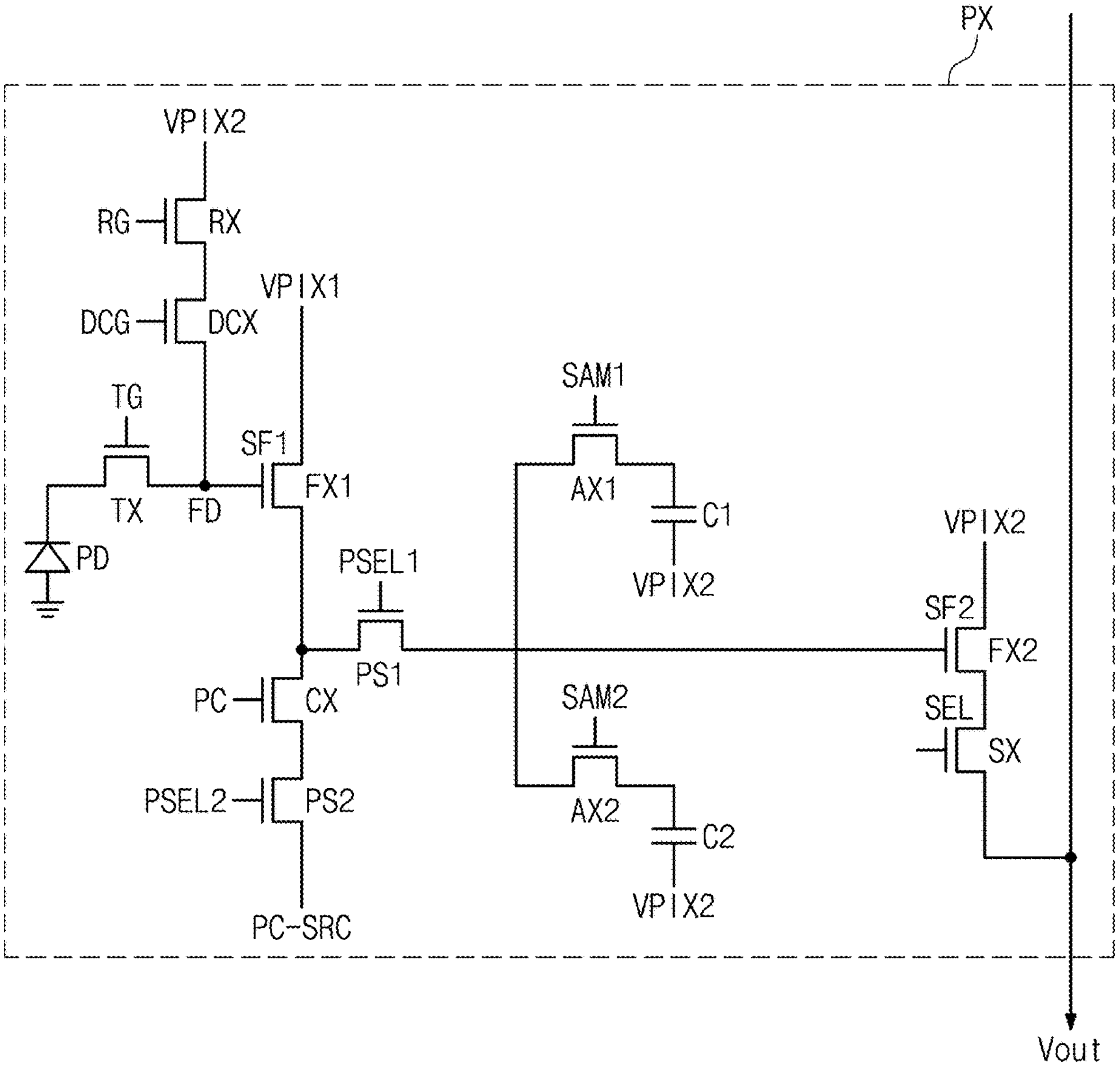
FIG. 9 is a circuit diagram of an image sensor according to embodiments of the inventive concept.

FIG. 9 is a circuit diagram of an image sensor according to embodiments of the inventive concept.

Referring to FIG. 9, an image sensor according to the present example may have a structure in which one capacitor is excluded from the circuit diagram of FIG. 2. For example, a first capacitor C1 may be connected to one terminal of a first sampling transistor AX1. A second capacitor C2 may be connected to one terminal of a second sampling transistor AX2. There is no capacitor connected between the first sampling transistor AX1 and the second sampling transistor AX2. Other structures may be the same/similar to those described with reference to FIG. 2.

Figure 10:
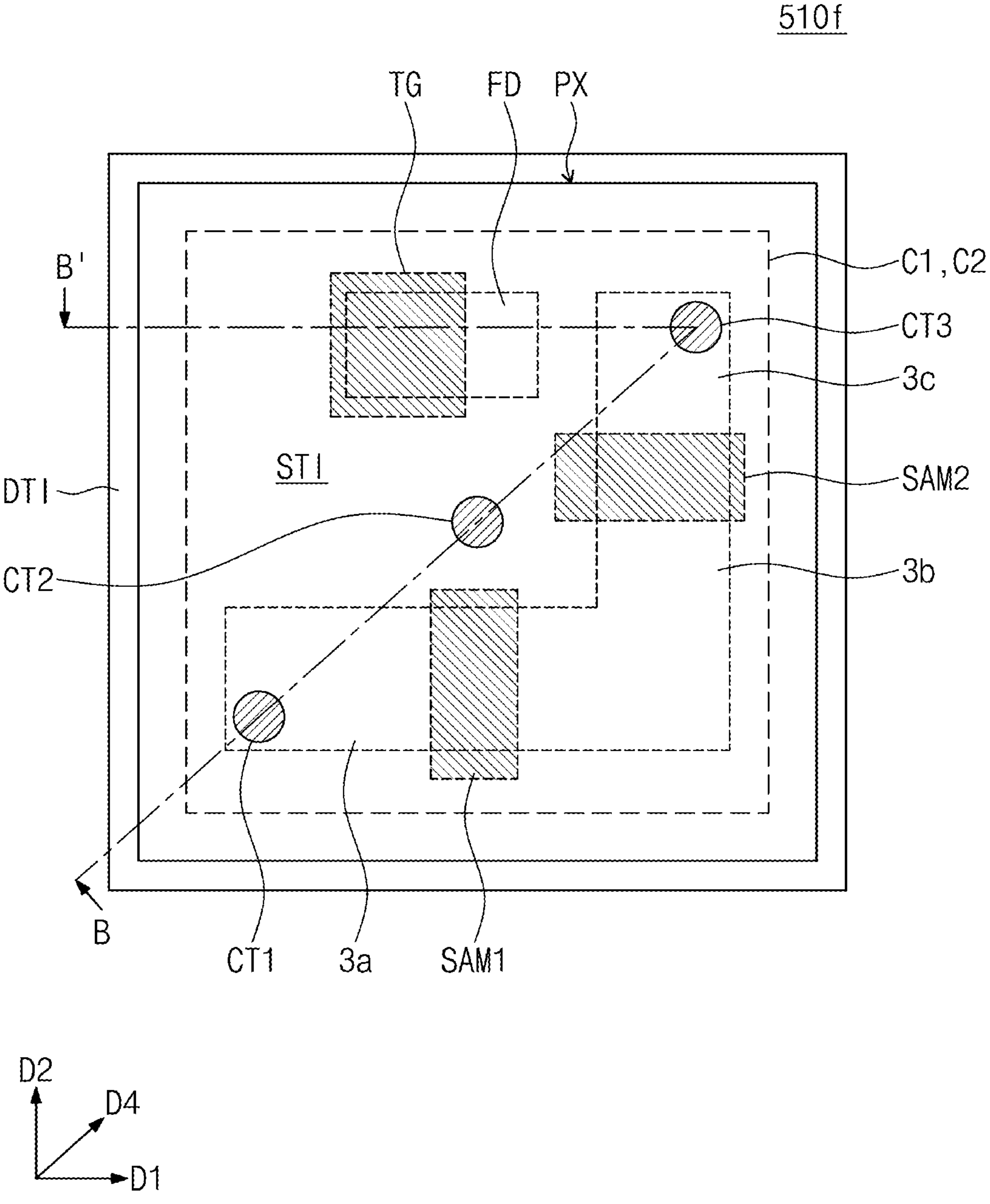
FIG. 10 is a top view of a pixel in an image sensor according to embodiments of the inventive concept.
Figure 11A:
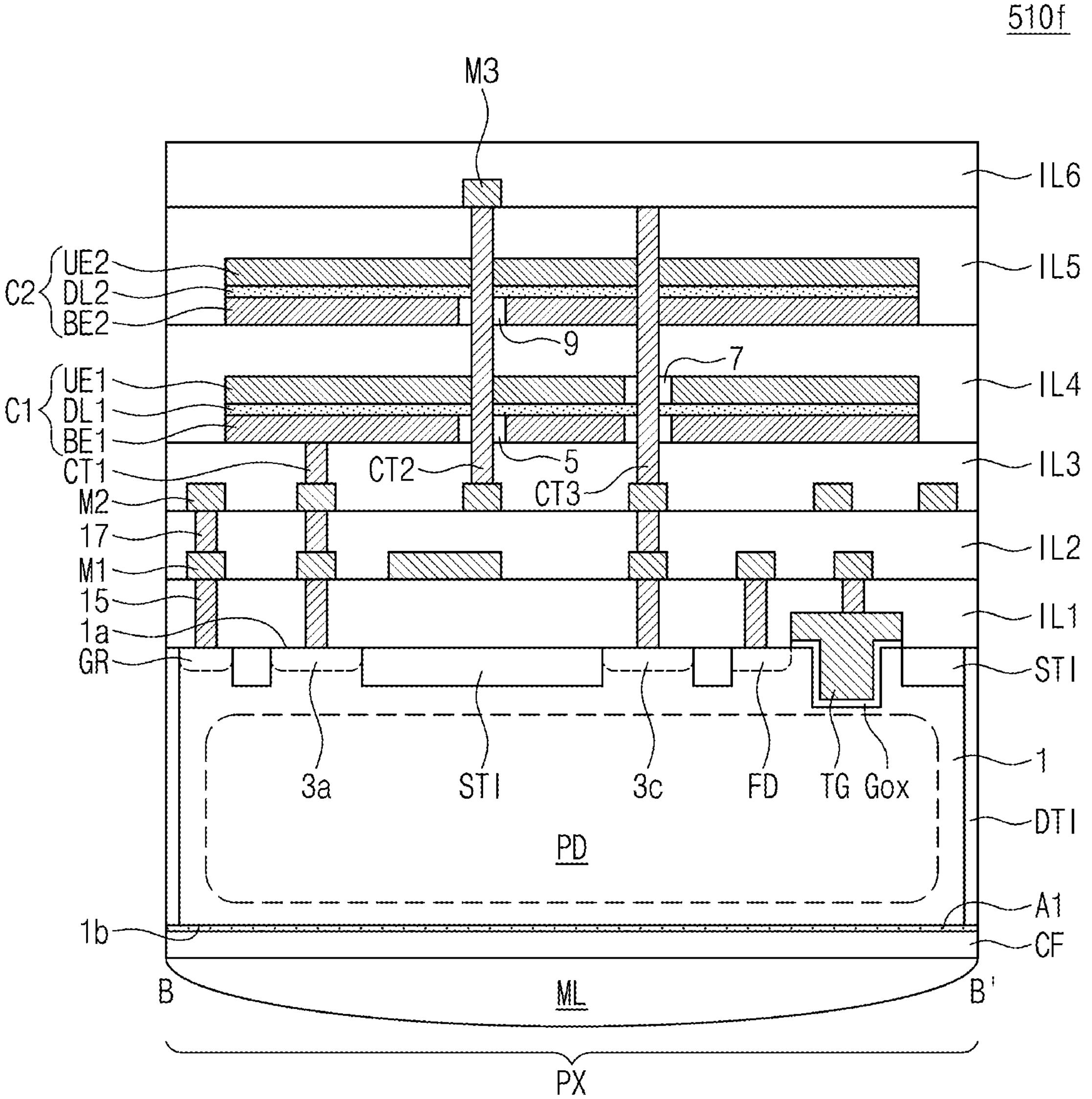
FIG. 11A is a cross-sectional view taken along line B-B' of FIG. 10 according to embodiments of the inventive concept.
Figure 11B:
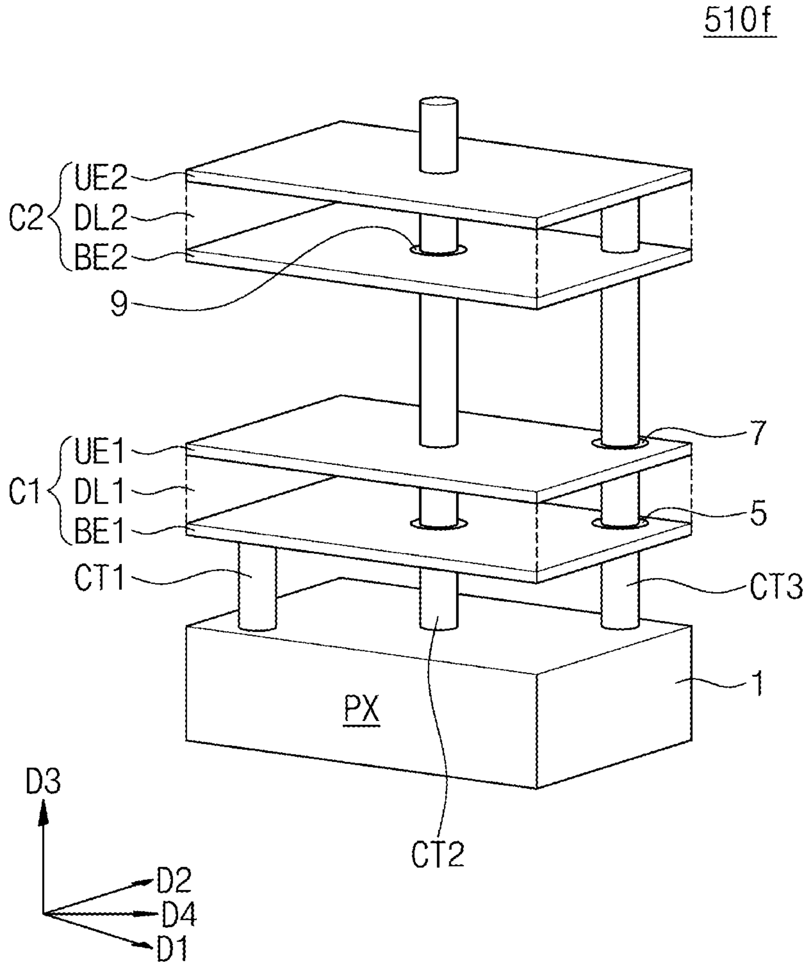
FIG. 11B is a schematic perspective view of the image sensor of FIG. 11A.

FIG. 10 is a top view of a pixel in an image sensor according to embodiments of the inventive concept. FIG. 11A is a cross-sectional view taken along line B-B' of FIG. 10 according to embodiments of the inventive concept. FIG. 11B is a schematic perspective view of the image sensor of FIG. 11A.

Referring to FIGS. 10, 11A, and 11B, an image sensor 510*f* according to the present example includes two capacitors C1 and C2 stacked on one pixel PX. A first capacitor C1 may be disposed on the third interlayer insulating layer IL3. The first capacitor C1 may include a first lower electrode BE1, a first dielectric layer DL1, and a first upper electrode UE1 that are sequentially stacked. The first capacitor C1 is covered with the fourth interlayer insulating layer IL4. A second capacitor C2 may be disposed on the fourth interlayer insulating layer IL4. The second capacitor C2 may include a second lower electrode BE2, a second dielectric layer DL2, and a second upper electrode UE2 that are sequentially stacked. The second capacitor C2 is covered with the fifth interlayer insulating layer IL5.

The first contact plug CT1 may be electrically connected to the first lower electrode BE1 of the first capacitor C1. The first contact plug CT1 may penetrate the third interlayer insulating layer IL3 and may be in contact with a lower surface of the first lower electrode BE1. The first contact plug CT1 may connect the first lower electrode BE1 to the first impurity region 3*a*.

The second contact plug CT2 may be electrically connected to the upper electrodes UE1 and UE2 of the first and second capacitors C1 and C2, respectively. The second power voltage VPIX2 of FIG. 9 may be applied to the upper electrodes UE1 and UE2 through the second contact plug CT2. The second contact plug CT2 may penetrate the third interlayer insulating layer IL3, the first lower electrode BE1, the first dielectric layer DL1, the first upper electrode UE1, the fourth interlayer insulating layer IL4, the second lower electrode BE2, the second dielectric layer DL2, the second upper electrode UE2, and the fifth interlayer insulating layer IL5. The second contact plug CT2 may be in contact with the upper electrodes UE1 and UE2 of the first and second capacitors C1 and C2, respectively. The second contact plug CT2 may be insulated from the lower electrodes BE1 and BE2 of the first and second capacitors C1 and C2. A first electrode insulation pattern 5 may be interposed between the second contact plug CT2 and the first lower electrode BE1. A third electrode insulation pattern 9 may be interposed between the second contact plug CT2 and the second lower electrode BE2. The first electrode insulation pattern 5 and the third electrode insulation pattern 9 may surround the second contact plug CT2. The second contact plug CT2 is not connected to the second impurity region 3*b*. For example, the second contact plug CT2 may overlap a device isolator STI.

The third contact plug CT3 may be electrically connected to the second lower electrode BE2 of the second capacitor C2. The third contact plug CT3 may also contact the second upper electrode UE2 of the second capacitor C2. The third contact plug CT3 may penetrate the third interlayer insulating layer IL3, the first lower electrode BE1, the first dielectric layer DL1, the first upper electrode UE1, and the fourth interlayer insulating layer IL4, and may be in contact with a lower surface of the second lower electrode BE2. The third contact plug CT3 may also penetrate the second capacitor C2 and the fifth interlayer insulating layer IL5. The third contact plug CT3 may be insulated from the first lower electrode BE1 and the first upper electrode UE1. A first electrode insulation pattern 5 may be disposed between the third contact plug CT3 and the first lower electrode BE1. A second electrode insulation pattern 7 may be disposed between the third contact plug CT3 and the first upper electrode UE1. The first electrode insulation pattern 5 and the second electrode insulation pattern 7 may surround the third contact plug CT3. The third contact plug CT3 may connect the second lower electrode BE2 to the third impurity region 3*c*.

When viewed in a plan view, the first to third contact plugs CT1 to CT3 may be arranged side by side in a fourth direction D4 that intersects the first and second directions D1 and D2. The second contact plug CT2 may be disposed at a center of the pixel PX. The first and third contact plugs CT1 and CT3 may be arranged adjacent to opposite corners of the pixel PX. The arrangement of the first and third contact plugs CT1 and CT3 is not limited thereto and may be variously changed. Other structures may be the same/similar to those described above.

Figure 12A:
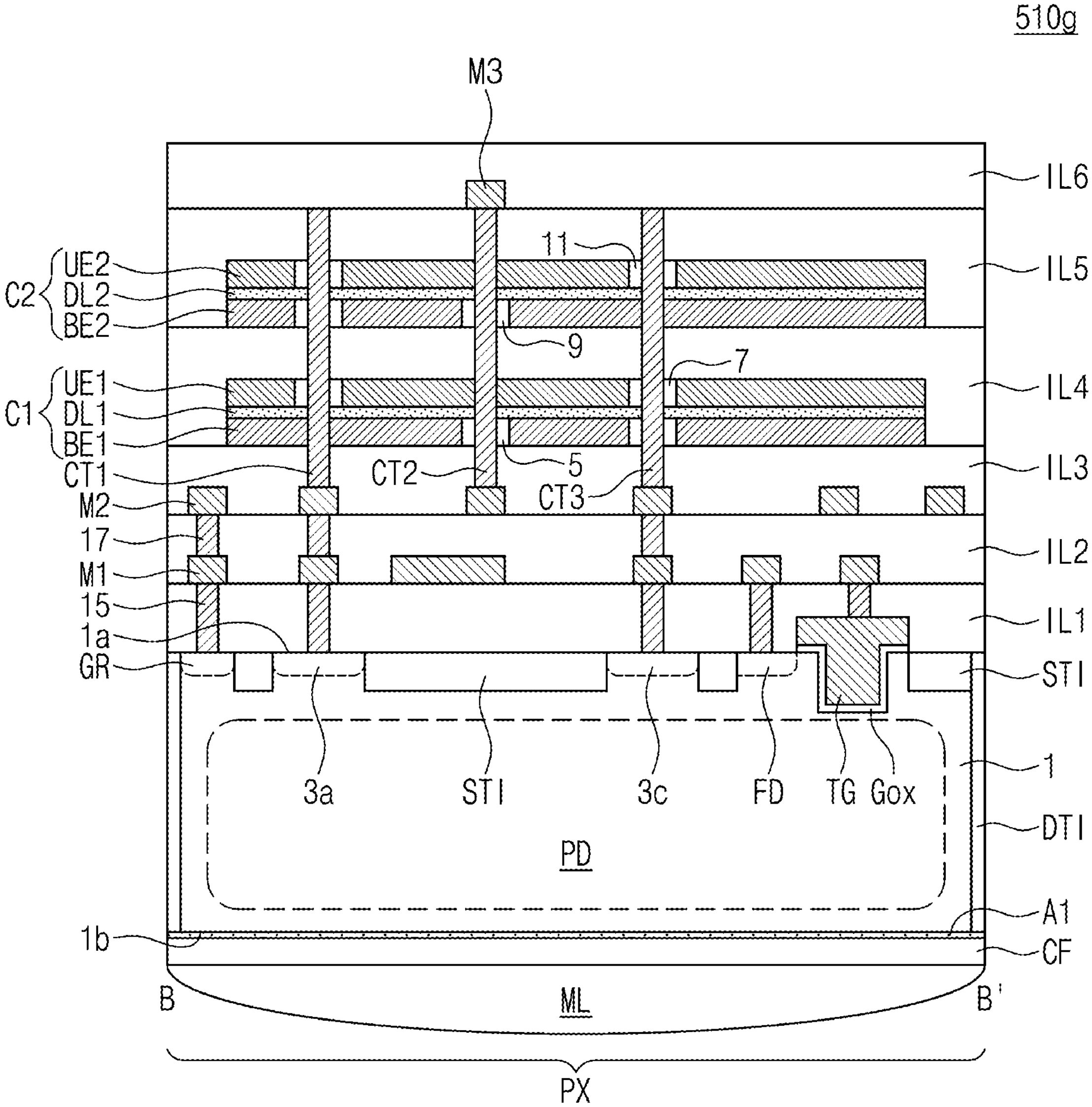
FIG. 12A is a cross-sectional view taken along line B-B' of FIG. 10 according to embodiments of the inventive concept.
Figure 12B:
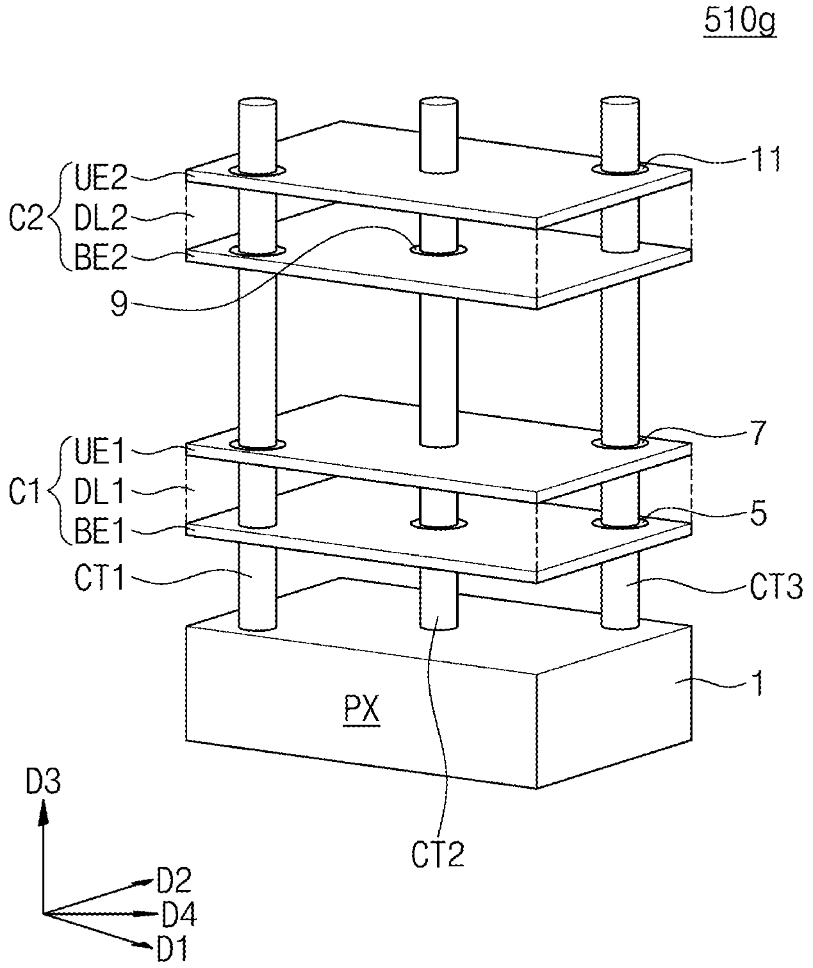
FIG. 12B is a schematic perspective view of the image sensor of FIG. 12A.

FIG. 12A is a cross-sectional view taken along line B-B' of FIG. 10 according to embodiments of the inventive concept. FIG. 12B is a schematic perspective view of the image sensor of FIG. 12A.

Referring to FIGS. 12A and 12B, in an image sensor 510*g* according to the present example, all of the first to third contact plugs CT1 to CT3 may penetrate the third interlayer insulating layer IL3 and the first lower electrode BE1, the first dielectric layer DL1, the first upper electrode UE1, the fourth interlayer insulating layer IL4, the second lower electrode BE2, the second dielectric layer DL2, the second upper electrode UE2, and the fifth interlayer insulating layer IL5. Each of the first to third contact plugs CT1 to CT3 may have the same height.

The first contact plug CT1 may be in contact with a side surface of the first lower electrode BE1, but may be insulated from the first upper electrode UE1, the second lower electrode BE2, and the second upper electrode UE2. The second electrode insulation pattern 7 may be interposed between the first contact plug CT1 and the first upper electrode UE1, the third electrode insulation pattern 9 may be interposed between the first contact plug CT1 and the second lower electrode BE2, and the fourth electrode insulation pattern 11 may be interposed between the first contact plug CT1 and the second upper electrode UE2.

The third contact plug CT3 may be in contact with a side surface of the second lower electrode BE2, but may be insulated from the first lower electrode BE1, the first upper electrode UE1, and the second upper electrode UE2. The first electrode insulation pattern 5 may be interposed between the third contact plug CT3 and the first lower electrode BE1, the second electrode insulation pattern 7 may be interposed between the third contact plug CT3 and the first upper electrode UE1, and the fourth electrode insulation pattern 11 may be interposed between the third contact plug CT3 and the second upper electrode UE2. Other structures may be the same/similar to those described with reference to FIGS. 11A and 11B.

Figure 13:
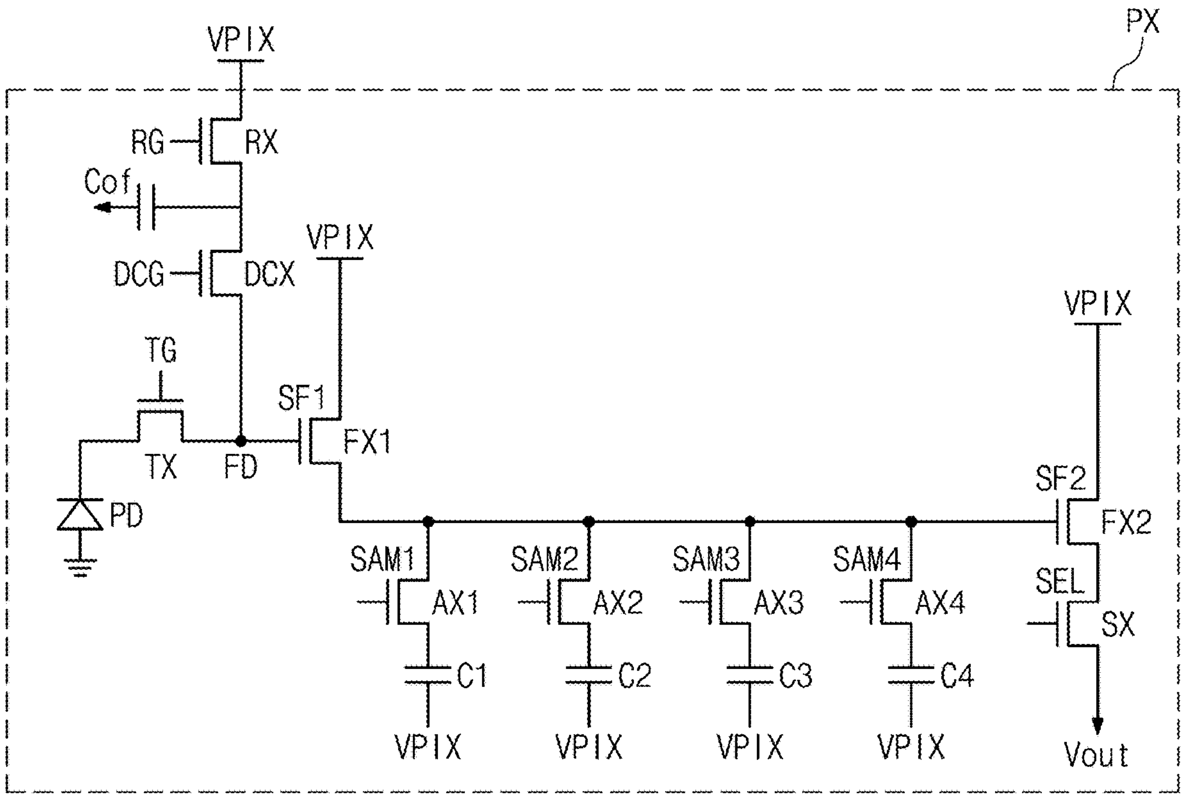
FIG. 13 is a circuit diagram of an image sensor according to embodiments of the inventive concept.

FIG. 13 is a circuit diagram of an image sensor according to embodiments of the inventive concept.

Referring to FIG. 13, each pixel PX of an image sensor may include a photoelectric convertor PD, a transfer transistor TX, a reset transistor RX, first and second source follower transistors FX1 and FX2, a dual conversion transistor DCX, first, second, third and fourth sampling transistors AX1, AX2, AX3 and AX4, a selection transistor SX, and first, second, third and fourth capacitors C1, C2, C3 and C4.

The photoelectric convertor PD may be a photodiode including an N-type impurity region and a P-type impurity region. A first terminal of the transfer transistor TX may be connected to the photoelectric convertor PD. A second terminal of the transfer transistor TX may be a floating diffusion region FD. The floating diffusion region FD may be connected to a first terminal of the dual conversion transistor DCX. A second terminal of the dual conversion transistor DCX may be connected to a first terminal of the reset transistor RX. A capacitor Cof may be disposed between the dual conversion transistor DCX and the reset transistor RX.

The floating diffusion region FD may be electrically connected to a gate of the first source follower transistor FX1. A first terminal of the first source follower transistor FX1 is connected to first terminals of the first to fourth sampling transistors AX1 to AX4. Second terminals of the sampling transistors AX1 to AX4 are respectively connected to the first to fourth capacitors C1 to C4. The first terminal of the first source follower transistor FX1 is connected to a gate of the second source follower transistor FX2. The second source follower transistor FX2 is connected to the selection transistor SX.

Depending on a capacitance of the capacitor Cof and the amount of electrons (charge) provided by the transfer transistor TX, a voltage level of the floating diffusion region FD may be determined. The reset transistor RX may reset the floating diffusion region FD. For example, when the dual conversion transistor DCX is turned on, the reset transistor RX may electrically connect the floating diffusion region FD to the power supply voltage VPIX in response to an electrical signal (reset signal) applied to a reset gate. The reset transistor RX may remove or emit electrons stored in the floating diffusion region FD by driving the voltage level of the floating diffusion region FD to the power supply voltage VPIX based on the reset signal. The dual conversion transistor DCX can vary the conversion gain by being turned on or off.

The first source follower transistor FX1 may output an output signal to the first to fourth sampling transistors AX1 to AX4 and the second source follower transistor FX2 based on the voltage level of the floating diffusion region FD. During operations at low or high light intensity, one or more of the first to fourth sampling transistors AX1 to AX4 may be turned on to store the output signal in one or more of the first to fourth capacitors C1 to C4. The output signal stored in one or more of the first to fourth capacitors C1 to C4 may turn on the corresponding one of the first to fourth sampling transistors AX1 to AX4 and may be sent to a gate of the second source follower transistor FX2. The selection transistor SX may transmit the output signal through an output line Vout based on the electrical signal applied to the selection gate.

In the image sensor according to the inventive concept, signal values obtained during operations at low, medium, and high light intensities may be stored using the first to fourth capacitors C1 to C4. As the result, the image sensor according to the inventive concept can produce clear images with enhanced high dynamic range (HDR) characteristics while also being highly integrated.

Figure 14:
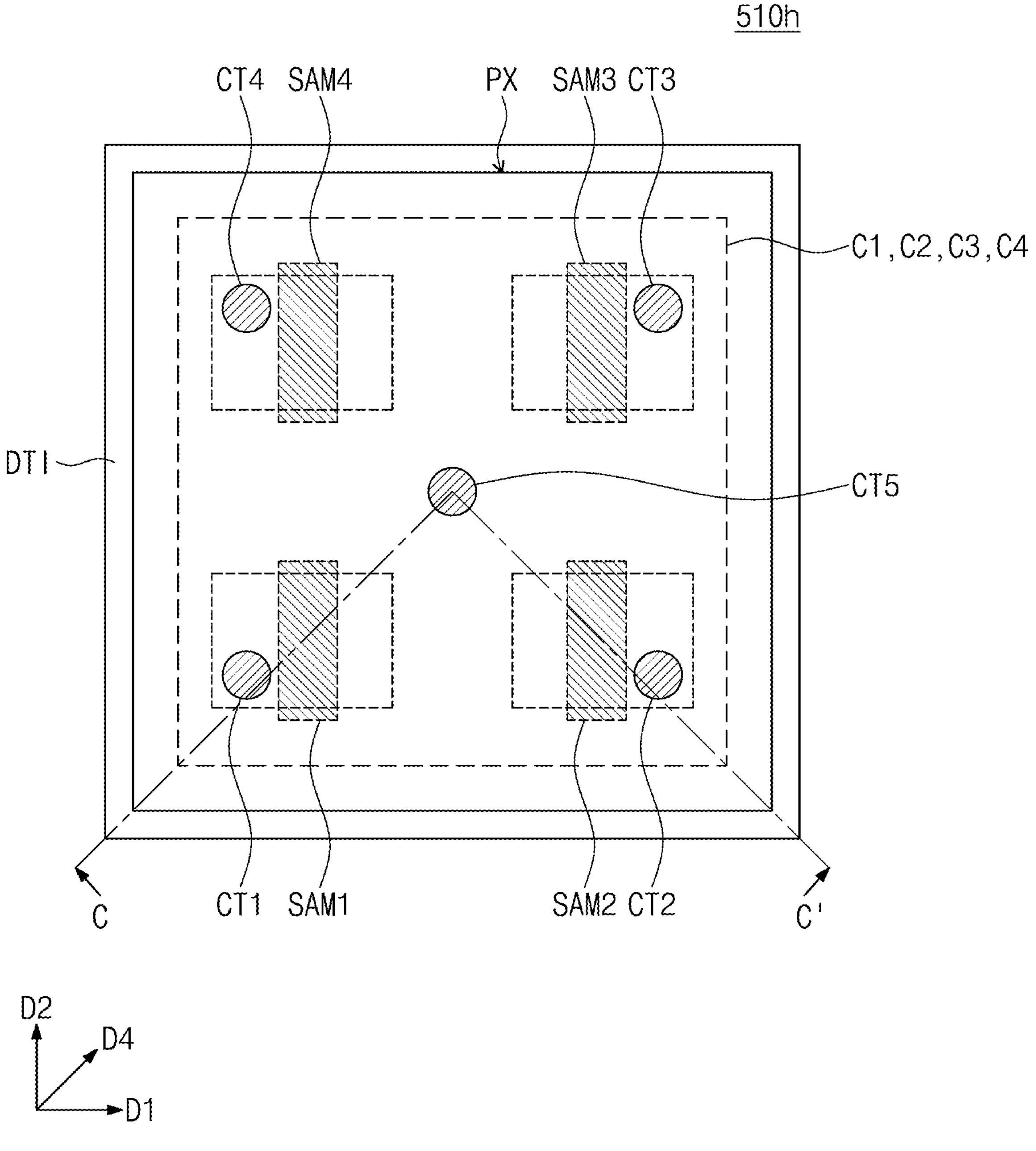
FIG. 14 is a top view of a pixel in an image sensor according to embodiments of the inventive concept.
Figure 15A:
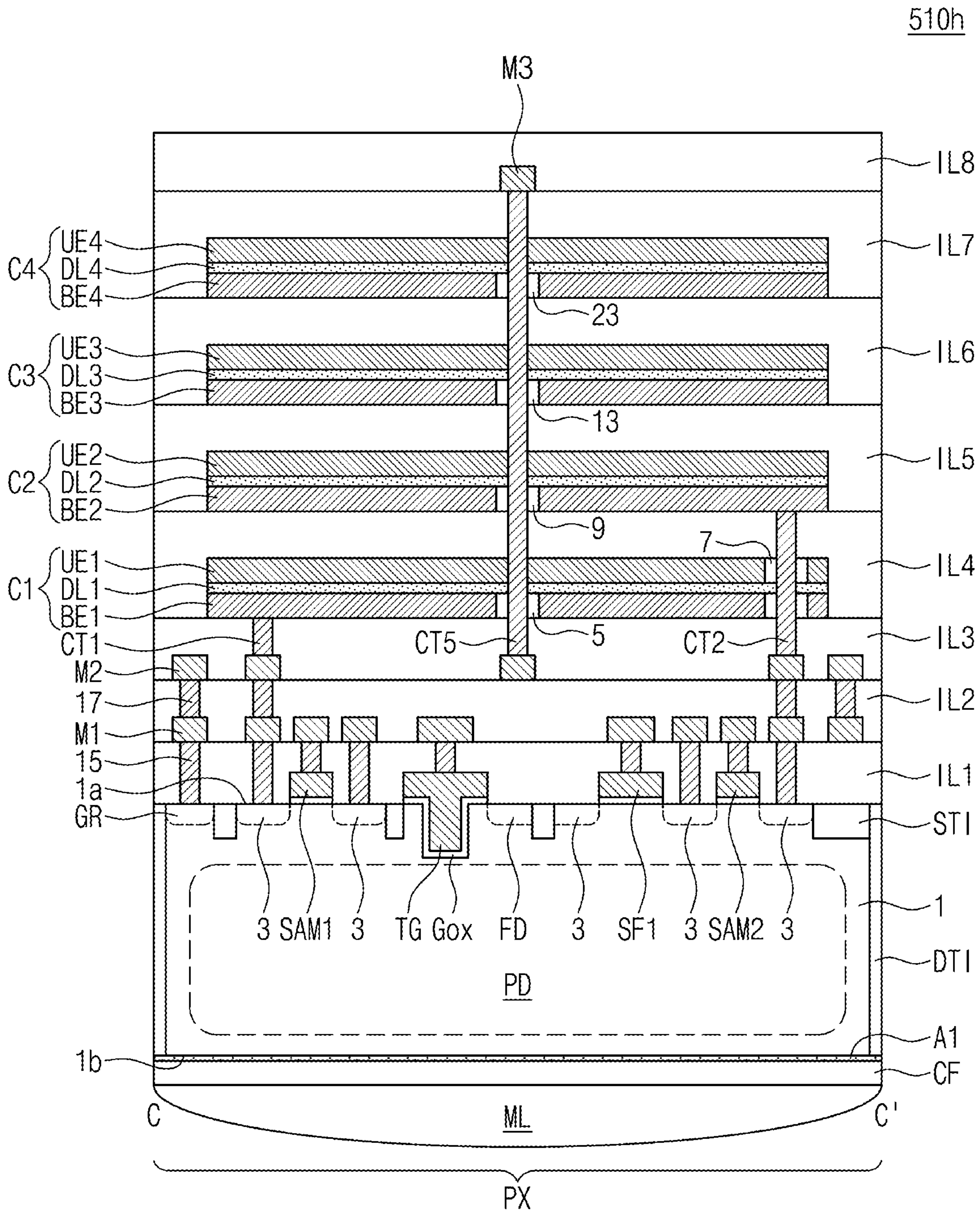
FIG. 15*a* is a cross-sectional view taken along line C-C' of FIG. 14 according to embodiments of the inventive concept.
Figure 15B:
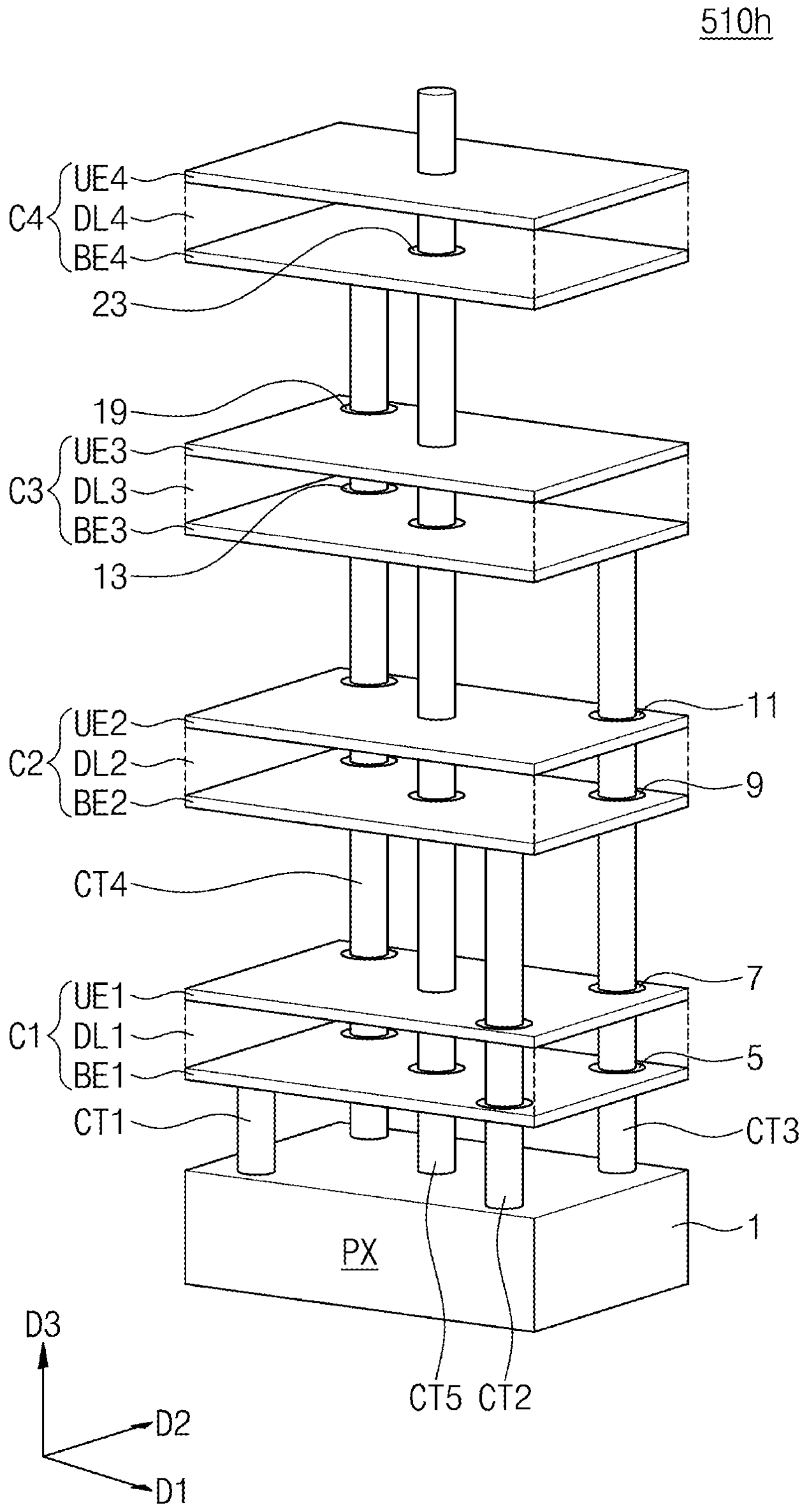
FIG. 15B is a schematic perspective view of the image sensor of FIG. 15A.

FIG. 14 is a top view of a pixel in an image sensor according to embodiments of the inventive concept. FIG. 15A is a cross-sectional view taken along line C-C' of FIG. 14 according to embodiments of the inventive concept. FIG. 15B is a schematic perspective view of the image sensor of FIG. 15A.

Referring to FIGS. 14, 15A, and 15B, an image sensor 510*h* according to the present example may be disposed on a front surface 1*a* of a first substrate 1 and may include first, second, third and fourth sampling gates SAM1, SAM2, SAM3 and SAM4 spaced apart from each other. The first to fourth sampling gates SAM1 to SAM4 may be arranged clockwise. In the cross section of FIG. 15A, the first source follower gate SF1 may be placed next to the second sampling gate SAM2. Impurity regions 3 may be disposed in the first substrate 1 on both side surfaces of the first to fourth sampling gates SAM1 to SAM4. Four capacitors C1 to C4 may be stacked on one pixel PX.

The first capacitor C1 may be disposed on the third interlayer insulating layer IL3. The first capacitor C1 may include a first lower electrode BE1, a first dielectric layer DL1, and a first upper electrode UE1 that are sequentially stacked. The first capacitor C1 is covered with the fourth interlayer insulating layer IL4.

The second capacitor C2 may be disposed on the fourth interlayer insulating layer IL4. The second capacitor C2 may include a second lower electrode BE2, a second dielectric layer DL2, and a second upper electrode UE2 that are sequentially stacked. The second capacitor C2 is covered with the fifth interlayer insulating layer IL5.

The third capacitor C3 may be disposed on the fifth interlayer insulating layer IL5. The third capacitor C3 may include a third lower electrode BE3, a third dielectric layer DL3, and a third upper electrode UE3 that are sequentially stacked. The third capacitor C3 is covered with the sixth interlayer insulating layer IL6.

The fourth capacitor C4 may be disposed on the sixth interlayer insulating layer IL6. The fourth capacitor C4 may include a fourth lower electrode BE4, a fourth dielectric layer DL4, and a fourth upper electrode UE4 that are sequentially stacked. The fourth capacitor C4 is covered with the seventh interlayer insulating layer IL7. A third wiring M3 is disposed on the seventh interlayer insulating layer IL7. The seventh interlayer insulating layer IL7 and the third wiring M3 are covered with an eighth interlayer insulating layer IL8.

Referring to FIGS. 14, 15A, and 15B, a first contact plug CT1 may be electrically connected to the first lower electrode BE1 of the first capacitor C1. The first contact plug CT1 may penetrate the third interlayer insulating layer IL3 and may be in contact with a lower surface of the first lower electrode BE1. The first contact plug CT1 may connect the first lower electrode BE1 to the impurity region 3 on one side surface of the first sampling gate SAM1.

A second contact plug CT2 may be electrically connected to the second lower electrode BE2 of the second capacitor C2. The second contact plug CT2 may penetrate the third interlayer insulating layer IL3, the first lower electrode BE1, the first dielectric layer DL1, the first upper electrode UE1, and the fourth interlayer insulating layer IL4, and may be in contact with a lower surface of the second lower electrode BE2. The second contact plug CT2 may be insulated from the first lower electrode BE1 and the first upper electrode UE1. A first electrode insulation pattern 5 may be disposed between the second contact plug CT2 and the first lower electrode BE1. A second electrode insulation pattern 7 may be disposed between the second contact plug CT2 and the first upper electrode UE1. The second electrode insulation pattern 7 may surround the second contact plug CT2. The second contact plug CT2 may connect the second lower electrode BE2 to the impurity region 3 on one side surface of the second sampling gate SAM2.

A third contact plug CT3 may be electrically connected to the third lower electrode BE3 of the third capacitor C3. The third contact plug CT3 may penetrate the third interlayer insulating layer IL3, the first lower electrode BE1, the first dielectric layer DL1, the first upper electrode UE1, the fourth interlayer insulating layer IL4, the second lower electrode BE2, the second dielectric layer DL2, the second upper electrode UE2, and the fifth interlayer insulating layer IL5, and may be in contact with a lower surface of the third lower electrode BE3. The third contact plug CT3 may be insulated from the first lower electrode BE1, the first upper electrode UE1, the second lower electrode BE2, and the second upper electrode UE2. The first electrode insulation pattern 5 may be disposed between the third contact plug CT3 and the first lower electrode BE1. The second electrode insulation pattern 7 may be disposed between the third contact plug CT3 and the first upper electrode UE1. The third electrode insulation pattern 9 may be disposed between the third contact plug CT3 and the second lower electrode BE2. The fourth electrode insulation pattern 11 may be disposed between the third contact plug CT3 and the second upper electrode UE2. The first electrode insulation pattern 5, the second electrode insulation pattern 7, the third electrode insulation pattern 9, and the fourth electrode insulation pattern 11 may surround the third contact plug CT3. The third contact plug CT3 may connect the third lower electrode BE3 to the impurity region 3 on one side surface of the third sampling gate SAM3.

A fourth contact plug CT4 may be electrically connected to the fourth lower electrode BE4 of the fourth capacitor C4. The fourth contact plug CT4 may penetrate the third interlayer insulating layer IL3, the first lower electrode BE1, the first dielectric layer DL1, the first upper electrode UE1, the fourth interlayer insulating layer IL4, the second lower electrode BE2, the second dielectric layer DL2, the second upper electrode UE2, the fifth interlayer insulating layer IL5, the third lower electrode BE3, the third dielectric layer DL3, the third upper electrode UE3, and the sixth interlayer insulating layer IL6, and may be in contact with a lower surface of the fourth lower electrode BE4. The fourth contact plug CT4 may be isolated from the first lower electrode BE1, the first upper electrode UE1, the second lower electrode BE2, the second upper electrode UE2, the third lower electrode BE3, and the third upper electrode UE3.

The first electrode insulation pattern 5 may be disposed between the fourth contact plug CT4 and the first lower electrode BEL. The second electrode insulation pattern 7 may be disposed between the fourth contact plug CT4 and the first upper electrode UE1. The third electrode insulation pattern 9 may be disposed between the fourth contact plug CT4 and the second lower electrode BE2. The fourth electrode insulation pattern 11 may be disposed between the fourth contact plug CT4 and the second upper electrode UE2. The fifth electrode insulation pattern 13 may be disposed between the fourth contact plug CT4 and the third lower electrode BE3. The sixth electrode insulation pattern 19 may be disposed between the fourth contact plug CT4 and the third upper electrode UE3. The first electrode insulation pattern 5, second electrode insulation pattern 7, third electrode insulation pattern 9, fourth electrode insulation pattern 11, fifth electrode insulation pattern 13 and sixth electrode insulation pattern 19 may surround the fourth contact plug CT4. The fourth contact plug CT4 may connect the fourth lower electrode BE4 to the impurity region 3 on one side surface of the fourth sampling gate SAM4.

A fifth contact plug CT5 may be electrically connected to the upper electrodes UE1, UE2, UE3, and UE4 of the first to fourth capacitors C1 to C4, respectively. The power supply voltage VPIX of FIG. 13 may be applied to the upper electrodes UE1, UE2, UE3, and UE4 through the fifth contact plug CT5. The fifth contact plug CT5 may penetrate the third interlayer insulating layer IL3, the first lower electrode BE1, the first dielectric layer DL1, the first upper electrode UE1, the fourth interlayer insulating layer IL4, the second lower electrode BE2, the second dielectric layer DL2, the second upper electrode UE2, the fifth interlayer insulating layer IL5, the third lower electrode BE3, the third dielectric layer DL3, the third upper electrode UE3, the sixth interlayer insulating layer IL6, the fourth lower electrode BE4, the fourth dielectric layer DL4, the fourth upper electrode UE4, and the seventh interlayer insulating layer IL7. The fifth contact plug CT5 may be in contact with the upper electrodes UE1, UE2, UE3, and UE4 of the first to fourth capacitors C1 to C4, respectively. The fifth contact plug CT5 may be insulated from the lower electrodes BE1, BE2, BE3, and BE4 of the first to fourth capacitors C1 to C4. The first electrode insulation pattern 5 may be interposed between the fifth contact plug CT5 and the first lower electrode BE1. The third electrode insulation pattern 9 may be interposed between the fifth contact plug CT5 and the second lower electrode BE2. The fifth electrode insulation pattern 13 may be interposed between the fifth contact plug CT5 and the third lower electrode BE3. A seventh electrode insulation pattern 23 may be interposed between the fifth contact plug CT5 and the fourth lower electrode BE4. The first electrode insulation pattern 5, the third electrode insulation pattern 9, the fifth electrode insulation pattern 13, and the seventh electrode insulation pattern 23 may surround the fifth contact plug CT5.

When viewed in a plan view, the first to fourth contact plugs CT1 to CT4 may be arranged clockwise. The first to fourth contact plugs CT1 to CT4 may be adjacent to corners of one pixel PX, respectively. The fifth contact plug CT5 may be disposed at a center of one pixel PX.

Figure 16A:
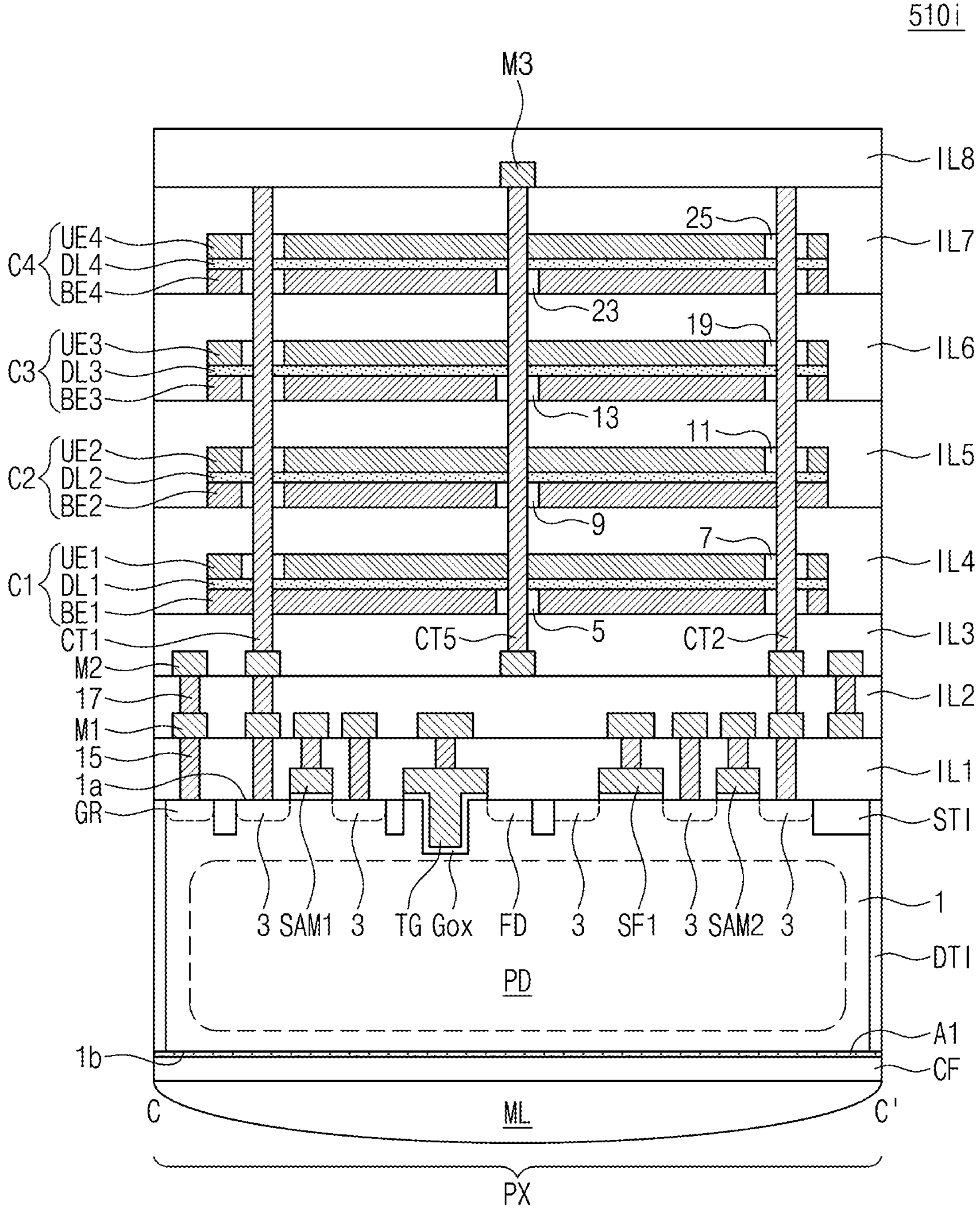
FIG. 16A is a cross-sectional view taken along line C-C' of FIG. 14 according to embodiments of the inventive concept.
Figure 16B:
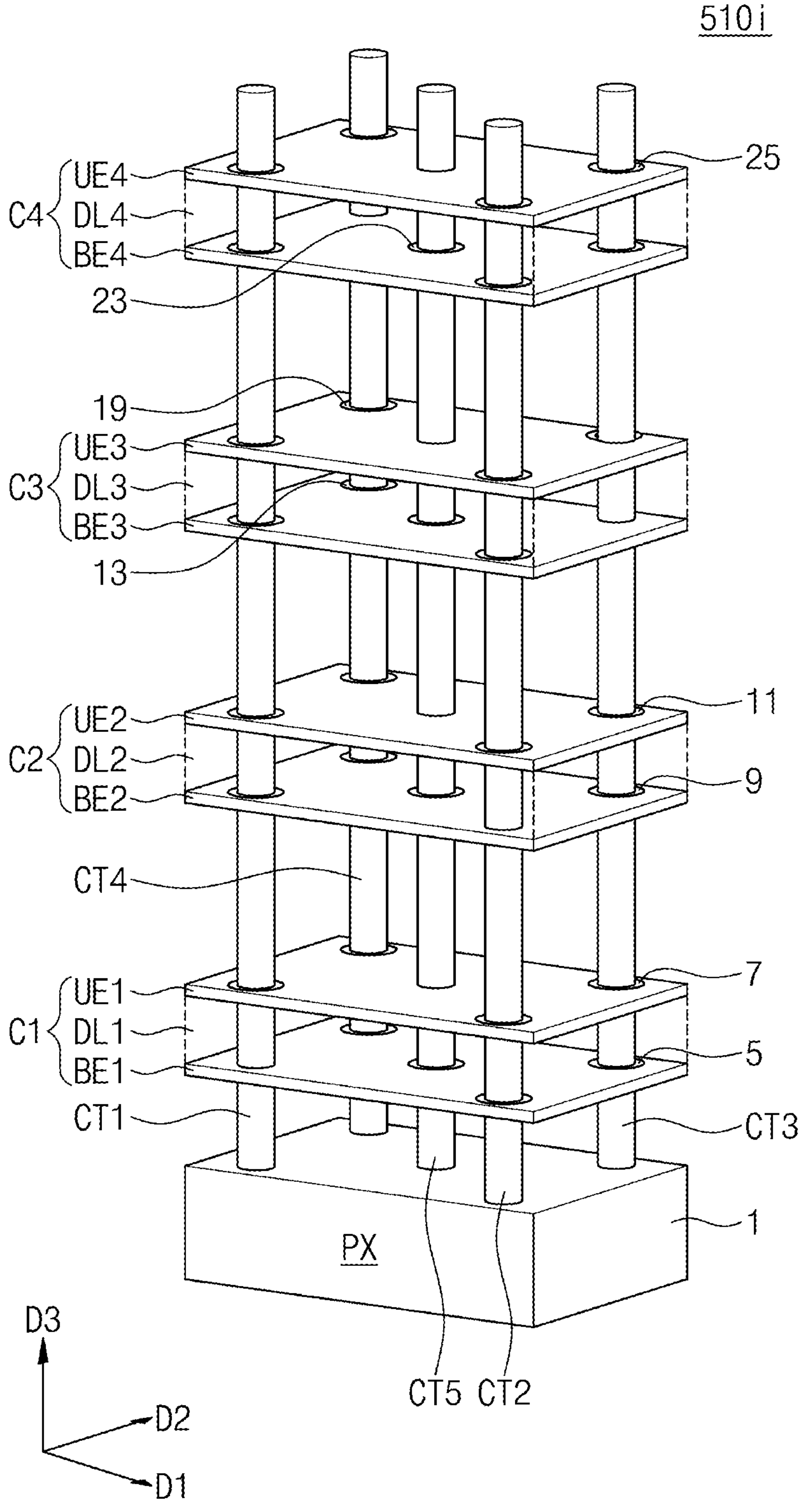
FIG. 16B is a schematic perspective view of the image sensor of FIG. 16A.

FIG. 16A is a cross-sectional view taken along line C-C' of FIG. 14 according to embodiments of the inventive concept. FIG. 16B is a schematic perspective view of the image sensor of FIG. 16A.

Referring to FIGS. 16A and 16B, in an image sensor **510*i*** according to the present example, all of first to fifth contact plugs CT1 to CT5 may penetrate the third interlayer insulating layer IL3, the first lower electrode BE1, the third interlayer insulating layer IL3, the first dielectric layer DL1, the first upper electrode UE1, the fourth interlayer insulating layer IL4, the second lower electrode BE2, the second dielectric layer DL2, the second upper electrode UE2, the fifth interlayer insulating layer IL5, the third lower electrode BE3, the third dielectric layer DL3, the third upper electrode UE3, the sixth interlayer insulating layer IL6, the fourth lower electrode BE4, the fourth dielectric layer DL4, the fourth upper electrode UE4, and the seventh interlayer insulating layer IL7. Each of the first to fifth contact plugs CT1 to CT5 may have the same height.

A first contact plug CT1 may be in contact with a side surface of the first lower electrode BE1, but may be isolated from the first upper electrode UE1, the second lower electrode BE2, the second upper electrode UE2, and the third lower electrode BE3, the third upper electrode UE3, the fourth lower electrode BE4, and the fourth upper electrode UE4. A second electrode insulation pattern 7 may be interposed between the first contact plug CT1 and the first upper electrode UE1, a third electrode insulation pattern 9 may be interposed between the first contact plug CT1 and the second lower electrode BE2, a fourth electrode insulation pattern 11 may be interposed between the first contact plug CT1 and the second upper electrode UE2, a fifth electrode insulation pattern 13 may be interposed between the first contact plug CT1 and the third lower electrode BE3, a sixth electrode insulation pattern 19 may be interposed between the first contact plug CT1 and the third upper electrode UE3, a seventh electrode insulation pattern 23 may be interposed between the first contact plug CT1 and the fourth lower electrode BE4, and an eighth electrode insulation pattern 25 may be interposed the first contact plug CT1 and the fourth upper electrode UE4.

A second contact plug CT2 may be in contact with the side surface of the second lower electrode BE2, but may be isolated from the first lower electrode BE1, the first upper electrode UE1, the second upper electrode UE2, and the third lower electrode BE3, the third upper electrode UE3, the fourth lower electrode BE4, and the fourth upper electrode UE4. A first electrode insulation pattern 5 may be interposed between the second contact plug CT2 and the first lower electrode BE1, a second electrode insulation pattern 7 may be interposed between the second contact plug CT2 and the first upper electrode UE1, a fourth electrode insulation pattern 11 may be interposed between the second contact plug CT2 and the second upper electrode UE2, a fifth electrode insulation pattern 13 may be interposed between the second contact plug CT2 and the third lower electrode BE3, a sixth electrode insulation pattern 19 may be interposed between the second contact plug CT2 and the third upper electrode UE3, a seventh electrode insulation pattern 23 may be interposed between the second contact plug CT2 and the fourth lower electrode BE4, and an eighth electrode insulation pattern 25 may be interposed between the second contact plug CT2 and the fourth upper electrode UE4.

A third contact plug CT3 may be in contact with the side surface of the third lower electrode BE3, but may be isolated from the first lower electrode BE1, the first upper electrode UE1, the second lower electrode BE2, the second upper electrode UE2, the third upper electrode UE3, the fourth lower electrode BE4, and the fourth upper electrode UE4. A first electrode insulation pattern 5 may be interposed between the third contact plug CT3 and the first lower electrode BE1, a second electrode insulation pattern 7 may be interposed between the third contact plug CT3 and the first upper electrode UE1, a third electrode insulation pattern 9 may be interposed between the third contact plug CT3 and the second lower electrode BE2, a fourth electrode insulation pattern 11 may be interposed between the third contact plug CT3 and the second upper electrode UE2, a sixth electrode insulation pattern 19 may be interposed between the third contact plug CT3 and the third upper electrode UE3, a seventh electrode insulation pattern 23 may be interposed between the third contact plug CT3 and the fourth lower electrode BE4, and an eighth electrode insulation pattern 25 may be interposed between the third contact plug CT3 and the fourth upper electrode UE4. Other structures may be the same/similar to those described above.

A fourth contact plug CT4 may be in contact with the side surface of the fourth lower electrode BE4, but be isolated from the first lower electrode BE1, the first upper electrode UE1, the second lower electrode BE2, the second upper electrode UE2, the third lower electrode BE3, the third upper electrode UE3, and the fourth upper electrode UE4. A first electrode insulation pattern 5 may be interposed between the fourth contact plug CT4 and the first lower electrode BE1, a second electrode insulation pattern 7 may be interposed between the fourth contact plug CT4 and the first upper electrode UE1, a third electrode insulation pattern 9 may be interposed between the fourth contact plug CT4 and the second lower electrode BE2, a fourth electrode insulation pattern 11 may be interposed between the fourth contact plug CT4 and the second upper electrode UE2, a fifth electrode insulation pattern 13 may be interposed between the fourth contact plug CT4 and the third lower electrode BE3, a sixth electrode insulation pattern 19 may be interposed between the fourth contact plug CT4 and the third upper electrode UE3, and an eighth electrode insulation pattern 25 may be interposed between the fourth contact plug CT4 and the fourth upper electrode UE4. Other structures may be the same/similar to those described with reference to FIGS. 15A and 15B.

In the image sensor of FIGS. 2 to 16B, one pixel PX is shown to include two to four sampling transistors and capacitors, but the number of sampling transistors and the number of capacitors connected thereto are limited to two to four, respectively, and may be five or more.

Figure 17:
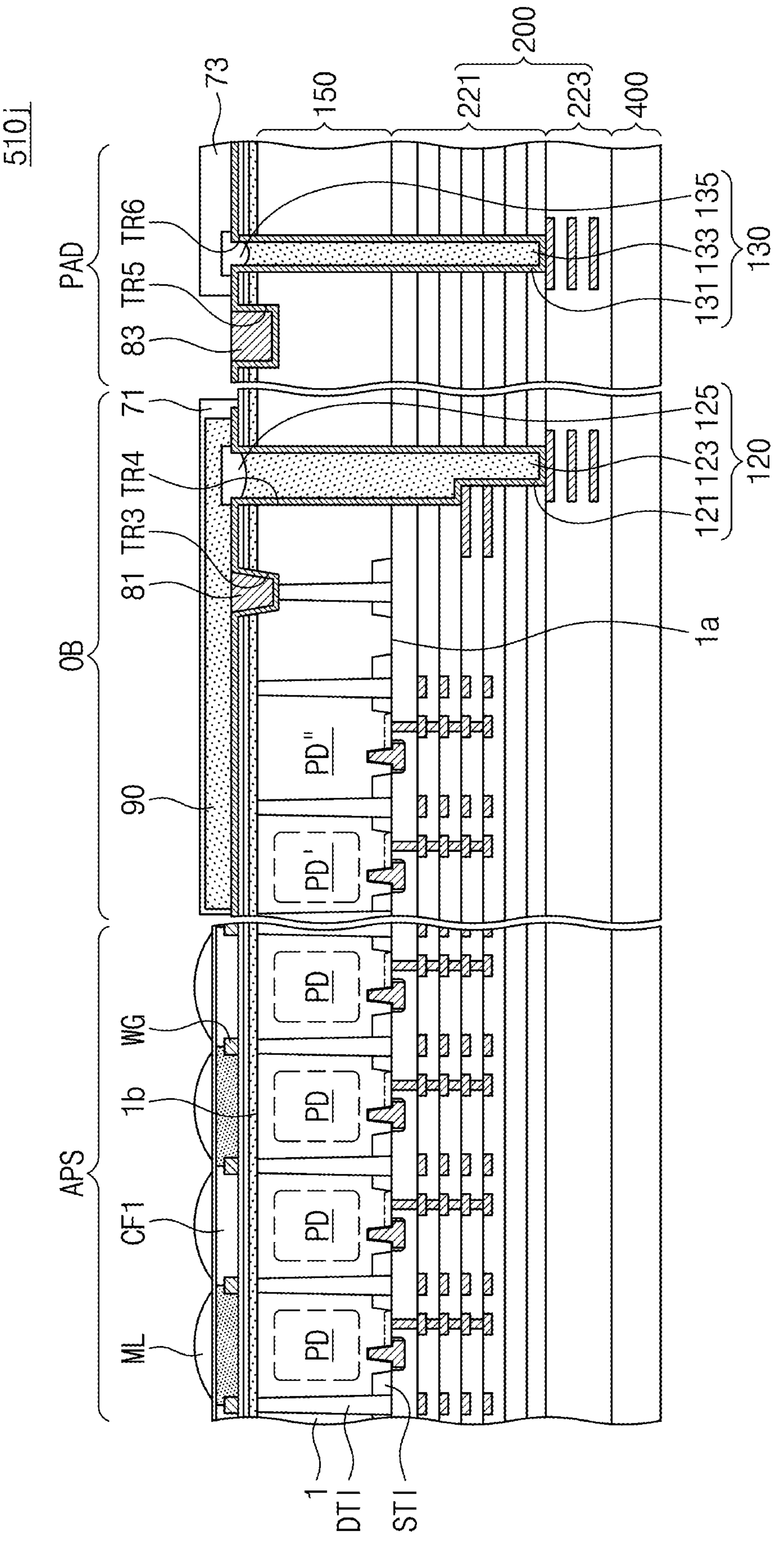
FIG. 17 is a cross-sectional view of an image sensor according to embodiments of the inventive concept.

FIG. 17 is a cross-sectional view of an image sensor according to embodiments of the inventive concept.

Referring to FIG. 17, an image sensor 510*j* according to the present example may include a first substrate 1 having a pixel array region APS, an optical black region OB, and a pad region PAD, a wiring layer 200 on a front surface 1*a* of the first substrate 1, and a second substrate 400 on the wiring layer 200. The wiring layer 200 may include an upper wiring layer 221 and the lower wiring layer 223. The pixel array region APS may include the plurality of pixels PX. The pixels PX disposed in the pixel array region APS may be substantially the same as those previously described with reference to FIGS. 2 to 16B. The capacitors shown in FIGS. 2 to 16B may be disposed in at least one of the upper wiring layer 221 and the lower wiring layer 223.

A light blocking pattern WG, a first connection structure 120, a first conductive pad 81, and a bulk color filter 90 may be provided on the first substrate 1 in the optical black region OB. The first connection structure 120 may include a first connection line 121, an electrode insulation pattern 123, and a first capping pattern 125.

A portion of the first connection line 121 may be provided on a rear surface 1*b* of the first substrate 1. The light blocking pattern WG may cover the rear surface 1*b* and may conformally cover inner walls of a third trench TR3 and a fourth trench TR4. The first connection line 121 may penetrate a photoelectric conversion layer 150 and the upper wiring layer 221 to connect the photoelectric conversion layer 150 and the wiring layer 200. For example, the first connection line 121 may be in contact with the wirings in the upper wiring layer 221 and the lower wiring layer 223 and a conductive pattern of a pixel separator DTI in the photoelectric conversion layer 150. Accordingly, the first connection line 121 may be electrically connected to wirings in the wiring layer 200. The first connection line 121 may include the metal material, such as tungsten. The light blocking pattern WG may block light incident into the optical black region OB.

The first conductive pad 81 may be provided inside the third trench TR3 to fill the remaining portion of the third trench TR3. The first conductive pad 81 may include the metal material, such as aluminum. The first conductive pad 81 may be connected to a separation conductive pattern 14 of FIG. 18. A negative bias voltage may be applied to the separation conductive pattern 14 of the pixel separator DTI of FIG. 18 through the first conductive pad 81. Therefore, white spots or dark current issues may be prevented or minimized.

The electrode insulation pattern 123 may fill the remaining portion of the fourth trench TR4. The electrode insulation pattern 123 may fully or partially penetrate the photoelectric conversion layer 150 and the wiring layer 200. The first capping pattern 125 may be provided on an upper surface of the electrode insulation pattern 123. The first capping pattern 125 may be provided on the electrode insulation pattern 123.

The bulk color filter 90 may be provided on the first conductive pad 81, the light blocking pattern WG, and the first capping pattern 125. The bulk color filter 90 may cover the first conductive pad 81, the light blocking pattern WG, and the first capping pattern 125. A first protective layer 71 may be provided on the bulk color filter 90 to seal the bulk color filter 90.

A photoelectric convertor PD' and the dummy region PD" may be provided in the optical black region OB of the first substrate 1. For example, the photoelectric convertor PD' may be doped with impurities of a second conductivity type different from a first conductivity type. The second conductivity type may be, for example, n-type. The photoelectric convertor PD' may have a similar structure to the photoelectric convertor PD, but may not perform the same operation (e.g., receiving light and generating an electrical signal) as the photoelectric convertor PD. The dummy region PD" may not be doped with impurities. A signal generated in the dummy region PD" may later be used as information to remove process noise.

In the pad region PAD, a second connection structure 130, a second conductive pad 83, and a second protective layer 73 may be provided on the first substrate 1. The second connection structure 130 may include a second connection line 131, an electrode insulation pattern 133, and a second capping pattern 135.

The second connection line 131 may be provided on the rear surface 1*b* of the first substrate 1. For example, the second connection line 131 may cover the rear surface 1*b* and conformally cover inner walls of a fifth trench TR5 and a sixth trench TR6. The second connection line 131 may penetrate the photoelectric conversion layer 150 and the upper wiring layer 221 to connect the photoelectric conversion layer 150 and the wiring layer 200. Specifically, the second connection line 131 may be in contact with wirings in the lower wiring layer 223. Accordingly, the second connection structure 130 may be electrically connected to wirings in the wiring layer 200. The second connection line 131 may include the metal material, such as tungsten.

The second conductive pad 83 may be provided inside the fifth trench TR5 to fill the remaining portion of the fifth trench TR5. The second conductive pad 83 may include the metal material, such as aluminum. The second conductive pad 83 may serve as an electrical connection path to the outside of the image sensor 510*j*. The electrode insulation pattern 133 may fill the remaining portion of the sixth trench TR6. The electrode insulation pattern 133 may fully or partially penetrate the photoelectric conversion layer 150 and the wiring layer 200. The second capping pattern 135 may be provided on the electrode insulation pattern 133.

Figure 18:
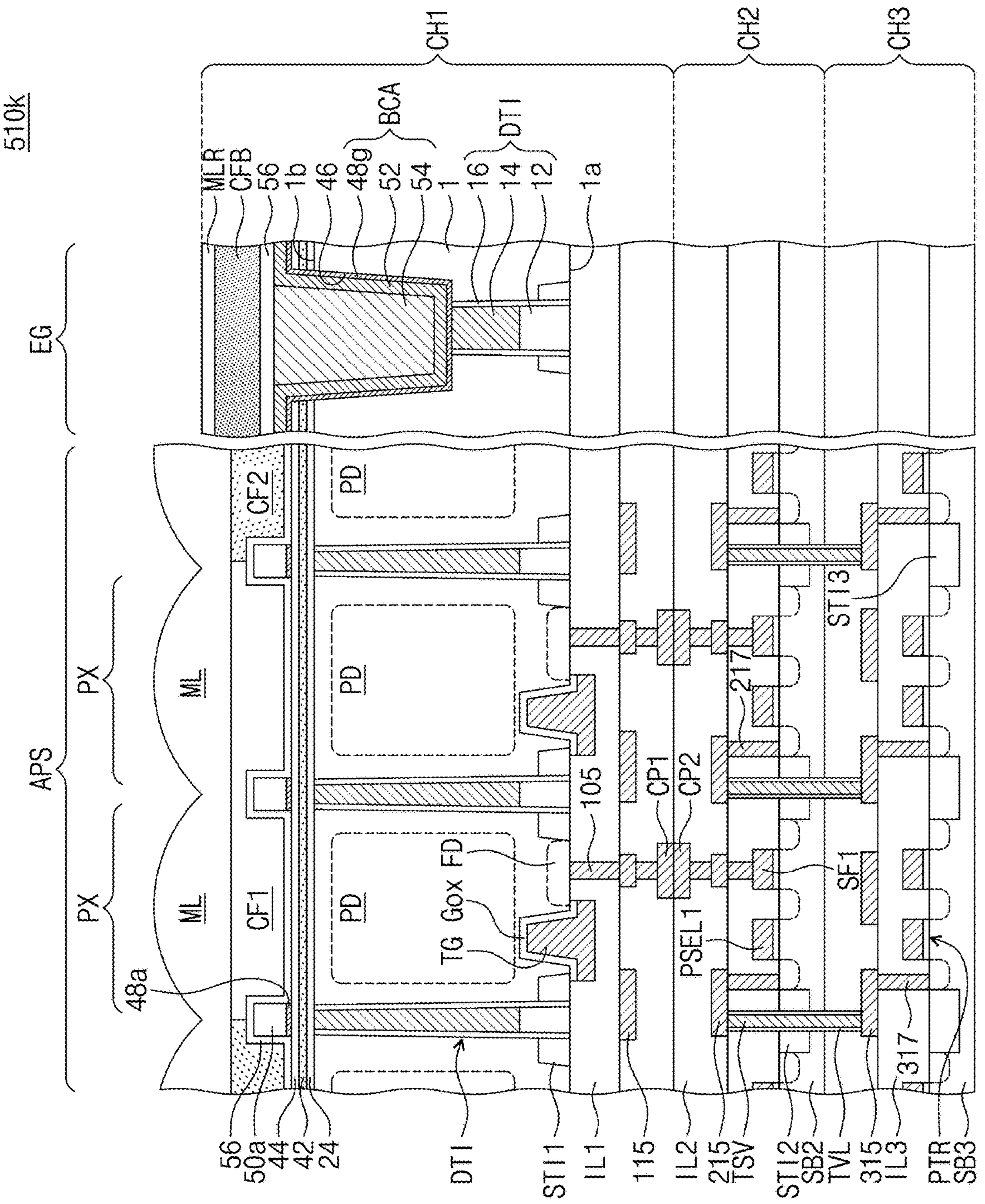
FIG. 18 is a cross-sectional view of an image sensor according to embodiments of the inventive concept.

FIG. 18 is a cross-sectional view of an image sensor according to embodiments of the inventive concept Referring to FIG. 18, an image sensor 510*k* according to the present example may have a structure in which first, second and third sub-chips CH1, CH2 and CH3 are sequentially bonded. The first sub-chip CH1 may perform an image sensing function. The first sub-chip CH1 may be the same as or similar to that described with reference to FIGS. 2 to 16B.

The first sub-chip CH1 may include transfer gates TG on the front surface 1*a* of the first substrate 1 and first interlayer insulating layers IL1 covering the transfer gates TG. The first substrate 1 may include a pixel array region APS and an edge region EG. The pixel array region APS may include the plurality of unit pixels PX. The edge region EG may correspond to the portion of the optical black region OB in FIG. 17.

A first device isolator STI1 is disposed on the first substrate 1 to define active regions. A pixel separator DTI is disposed on the first substrate 1 to separate/define the unit pixels PX in the pixel array region APS. The pixel separator DTI may extend to the edge region EG. The pixel separator DTI may include a buried electrode insulation pattern 12, a separation electrode insulation pattern 16, and a separation conductive pattern 14. The buried electrode insulation pattern 12 may be interposed between the separation conductive pattern 14 and a first interlayer insulating layer IL1. The separation electrode insulation pattern 16 may be interposed between the separation conductive pattern 14 and the first substrate 1 and between the buried electrode insulation pattern 12 and the first substrate 1.

The front surface 1*a* of the first substrate 1 may be covered with first interlayer insulating layers ILL. First chip wirings 115 may be disposed between or in the first interlayer insulating layers ILL. A floating diffusion region FD may be connected to the first chip wirings 115 by a first chip contact plug 105. A first conductive pad CP1 may be disposed in the lowermost first interlayer insulating layer ILL. The first conductive pad CP1 may include copper.

In the edge region EG, a connection contact plug BCA may penetrate a first protective layer 44, a fixed charge layer 24, and a portion of the first substrate 1 to be in contact with the separation conductive pattern 14. The connection contact plug BCA may be disposed in a third trench 46. The connection contact plug BCA may include an anti-diffusion pattern 48*g* that conformally covers an inner sidewall and a bottom surface of the third trench 46, a first metal pattern 52 on the anti-diffusion pattern 48*g*, and a second metal pattern 54 that fills the third trench 36. The anti-diffusion pattern 48*g* may include titanium, for example. The first metal pattern 52 may include, for example, tungsten. The second metal pattern 54 may include aluminum, for example. The anti-diffusion pattern 48*g* and the first metal pattern 52 may extend onto the first protective layer 44 and be electrically connected to other wirings or vias/contact plugs.

A second protective layer 56 is stacked on the first protective layer 44. The second protective layer 56 may conformally cover a light blocking pattern 48*a*, a low refractive pattern 50*a*, and the connection contact plug BCA.

A first optical black pattern CFB may be disposed on the second protective layer 56 in the edge region EG. For example, the first optical black pattern CFB may include the same material as a blue color filter.

A lens residual layer MLR may be disposed on the first optical black pattern CFB in the edge region EG. The lens residual layer MLR may include the same material as the micro lenses ML.

The second sub-chip CH2 may include a second substrate SB2, transistors RX, DCX, CX, FX1, FX2, PS1, PS2, AX1, AX2, and SX of FIG. 2 disposed thereon, and second interlayer insulating layers IL2. A second device isolator STI2 is disposed on the second substrate SB2 to define active regions. Second chip contact plugs 217 and second chip wirings 215 may be disposed in the second interlayer insulating layers IL2. A second conductive pad CP2 may be disposed in the uppermost second interlayer insulating layer IL2. The second conductive pad CP2 may include copper. The second conductive pad CP2 may be in contact with the first conductive pad CP1. First source follower gates SF1 may be respectively connected to the floating diffusion regions FD of the first sub-chip CH1.

The third sub-chip CH3 may include a third substrate SB3, peripheral transistors PTR disposed thereon, and third interlayer insulating layers IL3 covering them. A third device isolator STI3 is disposed on the third substrate SB3 to define active regions. Third chip contact plugs 317 and third chip wirings 315 may be disposed in the third interlayer insulating layers IL3. The uppermost third interlayer insulating layer IL3 is in contact with the second substrate SB2. A through electrode TSV may penetrate the second interlayer insulating layer IL2, the second device isolator STI2, the second substrate SB2, and the third interlayer insulating layer IL3 to be connected to a second chip wiring 215 and a third chip wiring 315. A sidewall of the through electrode TSV may be surrounded by a via insulating layer TVL. The third sub-chip CH3 may include circuits for driving the first and/or second sub-chips CH1 and CH2 or storing electrical signals generated from the first and/or second sub-chips CH1 and CH2.

The capacitors shown in FIGS. 2 to 16B may be disposed in at least one of the first to third interlayer insulating layers IL1, IL3, and IL3 of FIG. 18.

In the image sensor according to the inventive concept, multiple capacitors may be stacked on a single pixel. This arrangement allows each capacitor to occupy most of the pixel area, thereby increasing the capacitance of each capacitor. Additionally, since the contact plugs penetrate the capacitors, there is no need to allocate a separate space for the contact plugs. As a result, this design can achieve clear image quality with enhanced the high dynamic range (HDR) characteristics and provide a highly integrated image sensor capable of operating in global shutter mode.

While the embodiments described above provide examples, those skilled in the art will understand that many modifications and variations can be made without departing from the spirit and scope of the inventive concept as set forth in the following claims. Accordingly, the example embodiments of the inventive concept should be considered illustrative and not restrictive. The embodiments of FIG. 2 through FIG. 18 can be combined with each other.

What is claimed is:

1. An image sensor comprising:

a substrate having a first surface and a second surface that are opposite to each other;

a first capacitor disposed on the first surface, wherein the first capacitor includes a first lower electrode, a first dielectric layer, and a first upper electrode that are sequentially stacked;

a second capacitor disposed on the first capacitor, wherein the second capacitor includes a second lower electrode, a second dielectric layer, and a second upper electrode that are sequentially stacked; and a first contact plug penetrating the first lower electrode, the first dielectric layer, the first upper electrode, the second lower electrode, the second dielectric layer and the second upper electrode and contacting both the first upper electrode and the second upper electrode.

2. The image sensor of claim 1, further comprising a first electrode insulation pattern interposed between the first contact plug and the second lower electrode.

3. The image sensor of claim 1, further comprising a second contact plug in contact with the first lower electrode.

4. The image sensor of claim 3, wherein the second contact plug penetrates the first dielectric layer, the first upper electrode, the second lower electrode, the second dielectric layer, and the second upper electrode.

5. The image sensor of claim 4, further comprising a second electrode insulation pattern interposed between the second contact plug and the first upper electrode, between the second contact plug and the second lower electrode, and between the second contact plug and the second upper electrode.

6. The image sensor of claim 1, further comprising a third contact plug penetrating the first lower electrode, the first dielectric layer, and the first upper electrode and contacting the second lower electrode.

7. The image sensor of claim 6, wherein the third contact plug penetrates the second dielectric layer and the second upper electrode.

8. The image sensor of claim 6, further comprising a third electrode insulation pattern interposed between the third contact plug and the first lower electrode, between the third contact plug and the first dielectric layer, and between the third contact plug and the first upper electrode.

9. The image sensor of claim 1, wherein the first contact plug includes a contact pillar and a contact joint protruding laterally from a side surface of the contact pillar, wherein the contact pillar penetrates the first upper electrode, the second lower electrode, the second dielectric layer, and the second upper electrode, and wherein the contact joint is disposed between the contact pillar and the first upper electrode and between the contact pillar and the second upper electrode.

10. The image sensor of claim 9, wherein the first upper electrode includes a first electrode main portion and a first electrode joint, wherein the first electrode joint is interposed between the first electrode main portion and contacts the contact joint, and wherein the first electrode main portion has a first thickness, and the first electrode joint has a second thickness greater than the first thickness.

11. The image sensor of claim 1, further comprising:

a pixel separator disposed in the substrate to separate pixels; and photoelectric convertors respectively disposed in the pixels, wherein the first capacitor and the second capacitor overlap one of the photoelectric convertors.

12. An image sensor comprising:

a substrate having a first surface and a second surface that are opposite to each other;

a first capacitor disposed on the first surface, wherein the first capacitor includes a first lower electrode, a first dielectric layer, and a first upper electrode that are sequentially stacked;

a second capacitor disposed on the first capacitor, wherein the second capacitor includes a second lower electrode, a second dielectric layer, and a second upper electrode that are sequentially stacked; and a first contact plug that penetrates the first lower electrode, the first dielectric layer, the first upper electrode, the second lower electrode, the second dielectric layer, and the second upper electrode, and contacts the first lower electrode.

13. The image sensor of claim 12, wherein the first contact plug is insulated from the first upper electrode, the second lower electrode, and the second upper electrode.

14. The image sensor of claim 12, further comprising a second contact plug penetrating the first lower electrode, the first dielectric layer, the first upper electrode, the second lower electrode, the second dielectric layer and the second upper electrode, and contacting both the first upper electrode and the second upper electrode.

15. The image sensor of claim 12, further comprising a third contact plug penetrating the first lower electrode, the first dielectric layer, the first upper electrode, the second lower electrode, the second dielectric layer, and the second upper electrode, and contacting the second lower electrode.

16. The image sensor of claim 12, wherein the first contact plug includes a contact pillar and a contact joint protruding laterally from a side surface of the contact pillar, wherein the contact pillar penetrates the first lower electrode, the first dielectric layer, the first upper electrode, the second lower electrode, the second dielectric layer, and the second upper electrode, and wherein the contact joint is disposed between the contact pillar and the first lower electrode.

17. An image sensor comprising:

a substrate having a first surface and a second surface that are opposite to each other;

a pixel separator disposed in the substrate and separating a first pixel and a second pixel;

first and second photoelectric convertors respectively disposed in the first and second pixels;

a first interlayer insulating layer covering the first surface;

color filters on the second surface;

micro lenses on the color filters;

first lower electrodes disposed on the first interlayer insulating layer and overlapping the first and second pixels, respectively;

first dielectric layers respectively disposed on the first lower electrodes;

a first upper electrode disposed on the first dielectric layers and covering the first lower electrodes;

a second interlayer insulating layer covering the first upper electrode;

second lower electrodes disposed on the second interlayer insulating layer and overlapping the first and second pixels, respectively;

second dielectric layers respectively disposed on the second lower electrodes;

a second upper electrode disposed on the second dielectric layers and covering the second lower electrodes; and a first contact plug at each of the first and second pixels, the first contact plug penetrating the first lower electrode, the first dielectric layer, the first upper electrode, the second lower electrode, the second dielectric layer, the second upper electrode and contacting the first upper electrode and the second upper electrode.

18. The image sensor of claim 17, further comprising a second contact plug at each of the first and second pixels, the second contact plug penetrating the first lower electrode, the first dielectric layer, the first upper electrode, the second lower electrode, the second dielectric layer, and the second upper electrode, and contacting the first lower electrode.

19. The image sensor of claim 17, further comprising a third contact plug at each of the first and second pixels, the third contact plug penetrating the first lower electrode, the first dielectric layer, the first upper electrode, the second lower electrode, the second dielectric layer, and the second upper electrode, and contacting the second lower electrode.

20. The image sensor of claim 17, wherein the first contact plug includes a contact pillar and a contact joint protruding laterally from a side surface of the contact pillar, wherein the contact pillar penetrates the first lower electrode, the first dielectric layer, the first upper electrode, the second lower electrode, the second dielectric layer, and the second upper electrode, wherein the contact joint is located between the contact pillar and the first upper electrode and between the contact pillar and the second upper electrode.

* * * * *